United States Patent [19]
Khandros et al.

[11] Patent Number: 6,029,344
[45] Date of Patent: Feb. 29, 2000

[54] COMPOSITE INTERCONNECTION ELEMENT FOR MICROELECTRONIC COMPONENTS, AND METHOD OF MAKING SAME

[75] Inventors: Igor Y. Khandros, Orinda; Gaetan L. Mathieu, Dublin, both of Calif.

[73] Assignee: FormFactor, Inc., Livermore, Calif.

[21] Appl. No.: 09/132,843

[22] Filed: Aug. 12, 1998

Related U.S. Application Data

[63] Continuation of application No. 08/526,246, Sep. 21, 1995, which is a continuation-in-part of application No. 08/452,255, May 26, 1995, which is a continuation-in-part of application No. 08/340,144, Nov. 15, 1994, Pat. No. 5,917,707, which is a continuation-in-part of application No. 08/152,812, Nov. 16, 1993, Pat. No. 5,476,211.

[51] Int. Cl.$^7$ .................................................. H01R 43/16
[52] U.S. Cl. .......................... 29/874; 29/885; 29/896.9; 216/14
[58] Field of Search ............................ 29/843, 874, 885, 29/896.9; 216/14

[56] References Cited

U.S. PATENT DOCUMENTS

| | | |
|---|---|---|
| 2,869,040 | 1/1959 | Pifer . |
| 3,662,454 | 5/1972 | Miller ........................................ 29/470.1 |
| 4,085,502 | 4/1978 | Ostman et al. ............................. 29/629 |
| 4,707,657 | 11/1987 | Bøegh-Petersen .................... 324/158 F |
| 5,109,596 | 5/1992 | Driller et al. ............................... 29/705 |
| 5,139,427 | 8/1992 | Boyd et al. .................................. 439/66 |
| 5,228,861 | 7/1993 | Grabbe ........................................ 439/66 |

Primary Examiner—P. W. Echols
Attorney, Agent, or Firm—Blakely, Sokoloff, Taylor & Zafman

[57] ABSTRACT

Interconnection elements for electronic components, exhibiting desirable mechanical characteristics (such as resiliency, for making pressure contacts) are formed by shaping an elongate element (core) of a soft material (such as gold) to have a springable shape (including cantilever beam, S-shape, U-shape), and overcoating the shaped elongate element with a hard material (such as nickel and its alloys), to impart a desired spring (resilient) characteristic to the resulting composite interconnection element. A final overcoat of a material having superior electrical qualities (e.g., electrical conductivity and/or solderability) may be applied to the composite interconnection element. The elongate element may be formed from a wire, or from a sheet (e.g., metal foil). The resulting interconnection elements may be mounted to a variety of electronic components, including directly to semiconductor dies and wafers (in which case the overcoat material anchors the composite interconnection element to a terminal (or the like) on the electronic component), may be mounted to support substrates for use as interposers and may be mounted to substrates for use as probe cards or probe card inserts. In one embodiment, a hybrid composite interconnection element is formed by mounting a core to an end of an flat elongate element formed from a sheet, and overcoating at least the core, the flat elongate element providing a "floating" support for the overcoated core, capable of absorbing non-planarities (tolerances) of an electronic component. Methods of fabricating interconnection elements on sacrificial substrates are described. Methods of fabricating tip structures and contact tips at the end of interconnection elements are described.

15 Claims, 9 Drawing Sheets

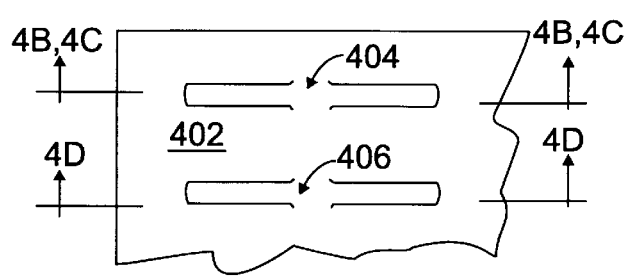
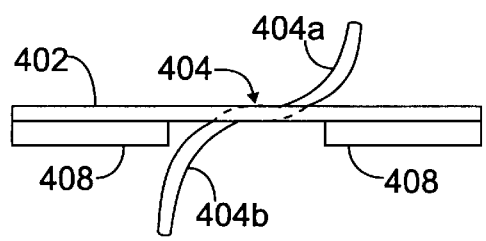
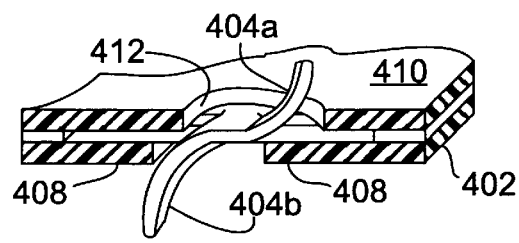
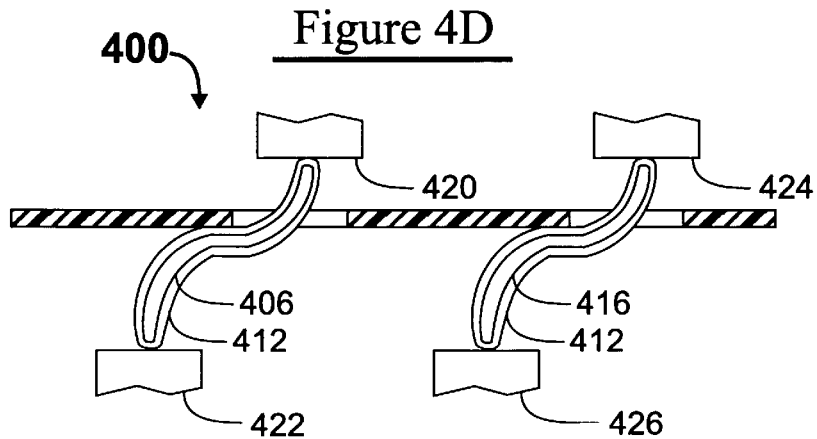

COMPOSITE INTERCONNECTION ELEMENT FOR MICROELECTRONIC COMPONENTS, AND METHOD OF MAKING SAME

CROSS-REFERENCE TO RELATED APPLICATIONS

This is a divisional application of U.S. patent application Ser. No.: 08/526,246 now abandoned which was filed on Sep. 21, 1995 which is a continuation-in-part of commonly-owned, copending U.S. patent application Ser. No. 08/452,255, filed May 26, 1995 ("PARENT CASE". status: pending), which is a continuation-in-part of commonly-owned, U.S. patent application Ser. No. 08/340,144 filed Nov. 15, 1994 now U.S. Pat. No. 5,917,707, which is a continuation-in-part of commonly-owned, U.S. patent application Ser. No. 08/152,812, filed Nov. 16, 1993 now U.S. Pat. No. 5,476,211.

TECHNICAL FIELD OF THE INVENTION

The invention relates to making interconnections between electronic components, especially microelectronic components and, more particularly, to interconnection elements exhibiting resiliency, and methods of making same.

BACKGROUND OF THE INVENTION

Electronic components, particularly microelectronic components such as semiconductor devices (chips), often have a plurality of terminals (also referred to as bond pads, electrodes, or conductive areas). In order to assemble such devices into a useful system (or subsystem), a number of individual devices must be electrically interconnected with one another, typically through the intermediary of a printed circuit (or wiring) board (PCB, PWB).

Semiconductor devices are typically disposed within a semiconductor package having a plurality of external connection points in the form of pins, pads, leads, solder balls, and the like. Many types of semiconductor packages are known, and techniques for connecting the semiconductor device within the package include bond wires, tape-automated bonding (TAB) and the like. In some cases, a semiconductor device is provided with raised bump contacts, and is connected by flip-chip techniques onto another electronic component.

Generally, interconnections between electronic components can be classified into the two broad categories of "relatively permanent" and "readily demountable".

An example of a "relatively permanent" connection is a solder joint. Once two components are soldered to one another, a process of unsoldering must be used to separate the components. A wire bond is another example of a "relatively permanent" connection.

An example of a "readily demountable" connection is rigid pins of one electronic component being received by resilient socket elements of another electronic component. The socket elements exert a contact force (pressure) on the pins in an amount sufficient to ensure a reliable electrical connection therebetween. Interconnection elements intended to make pressure contact with an electronic component are referred to herein as "springs" or "spring elements".

Spring elements are well known, and appear in a variety of shapes and sizes. In today's microelectronic environment, there is a profound need for all interconnection elements, including springs, to become smaller and smaller, in order that a large plurality of such interconnection elements can be disposed in a small area, to effect a high density of interconnections to electronic components.

Prior art techniques for making spring elements generally involve stamping (punching) or etching a spring material, such as phosphor bronze or beryllium copper or steel or a nickel-iron-cobalt (e.g., kovar) alloy, to form individual spring elements, shaping the spring elements to have a spring shape (e.g., arcuate, etc.), plating the spring elements with a good contact material (e.g., a noble metal such as gold, which will exhibit low contact resistance when contacting a like material), and molding a plurality of such shaped, plated spring elements into a linear, a peripheral or an array pattern. When plating gold onto the aforementioned materials, sometimes a thin (for example, 30–50 microinches, barrier layer of nickel is appropriate.

Various problems and limitations are inherent with such techniques of making spring elements.

For example, these processes are limited when applications demand that a plurality of springs (interconnection elements) be arranged at a fine (e.g., 10 mil) pitch. Such a fine pitch inherently demands that each spring be sized (i.e., in cross-section) substantially smaller (e.g., 3 mil) than the pitch. A punch-out area must be accommodated, and will limit how much material is left over to form springs. At best, even through it may be relatively straightforward to punch out springs as small as 1 mil, such small sizes impose limitations on the contact force that can reliably be exerted by the springs. This is especially poignant in the context of fabricating area arrays of springs.

Generally, a certain minimum contact force is desired to effect reliable pressure contact to electronic components (e.g., to terminals on electronic components). For example, a contact (load) force of approximately 15 grams (including as little as 2 grams or less and as much as 150 grams or more, per contact) may be desired to ensure that a reliable electrical connection is made to a terminal of an electronic component which may be contaminated with films on its surface, or which has corrosion or oxidation products on its surface. The minimum contact force required of each spring demands either that the yield strength of the spring material or that the size of the spring element are increased. As a general proposition, the higher the yield strength of a material, the more difficult it will be to work with (e.g., punch, bend, etc.). And the desire to make springs smaller essentially rules out making them larger in cross-section.

Another limitation attendant prior art interconnection elements is that when hard materials (such as would be used for making springs) are employed, relatively "hostile" (e.g., high temperature) processes such as brazing are required to mount the interconnection elements to terminals of an electronic component. For example, it is known to braze rigid pins to relatively "durable" semiconductor packages. Such "hostile" processes are generally not desirable (and often not feasible) in the context of certain relatively "fragile" electronic components such as semiconductor devices. In contrast thereto, wire bonding is an example of a relatively "friendly" processes which is much less potentially damaging to fragile electronic components than brazing. Soldering is another example of a relatively "friendly" process.

Another problem associated with mounting springs on electronic components is largely mechanical in nature. In cases where a spring is mounted at one end to a substrate (which, for purposes of this proposition is considered to be an immovable object), and is required to react forces applied at its free end, the "weak link" (weakest point, in service) will often be the point at which the spring is attached (e.g., the base of the spring is bonded) to the substrate (e.g., terminal of an electronic component). This accounts, at least in part, for the requirement to employ "hostile" processes (e.g., brazing) to mount the springs to the substrate.

Another subtle problem associated with interconnection elements, including spring contacts, is that, often, the terminals of an electronic component are not perfectly coplanar. Interconnection elements lacking in some mechanism incorporated therewith for accommodating these "tolerances" (gross non-planarities) will be hard pressed to make consistent contact pressure contact with the terminals of the electronic component.

The following U.S. Patents are cited as being of interest: U.S. Pat. Nos. 5,386,344; 5,336,380; 5,317,479; 5,086,337; 5,067,007; 4,989,069; 4,893,172; 4,793,814; 4,777,564; 4,764,848; 4,667,219; 4,642,889; 4,330,165; 4,295,700; 4,067,104; 3,795,037; 3,616,532; and 3,509,270.

BRIEF DESCRIPTION (SUMMARY) OF THE INVENTION

It is therefore an object of the invention to provide a technique for fabricating interconnection elements for electronic components, especially microelectronic components.

It is another object of the invention to provide interconnection elements that are suitable for making pressure contact to electronic components.

It is another object of the invention to provide a technique for securely anchoring interconnection elements to electronic components.

It is another object of the invention to provide a technique for manufacturing interconnection elements having controlled impedance.

According to the invention, techniques are disclosed for fabricating interconnection elements, particularly spring elements, and for mounting the interconnection elements to electronic components. The disclosed techniques overcome problems associated with making spring elements of extremely small size, yet capable of exerting contact forces of sufficient magnitude to ensure reliable interconnections. The disclosed techniques also, overcome problems associated with mounting springs on electronic components, such as semiconductor devices.

According to the invention, a composite interconnection element is fabricated by mounting an elongate element ("core") to an electronic component, shaping the core to have a spring shape, and overcoating the core to enhance the physical (e.g., spring) characteristics of the resulting composite interconnection element and/or to securely anchor the resulting composite interconnection element to the electronic component.

As used herein, the term "spring shape" refers to virtually any shape of an elongate element which will exhibit elastic (restorative) movement of an end (tip) of the elongate element with respect to a force applied to the tip. This includes elongate elements shaped to have one or more bends, as well as substantially straight elongate elements.

Alternatively, the core is shaped prior to mounting to an electronic component.

Alternatively, the core is mounted to or is a part of a sacrificial substrate which is not an electronic component. The sacrificial substrate is removed after shaping, and either before or after overcoating. According to an aspect of the invention, tips having various rough surface finishes can be disposed at the contact ends of the interconnection elements. (See also FIGS. 11A–11F of the PARENT CASE.)

In an embodiment of the invention, the core is a "soft" material having a relatively low yield strength, and is overcoated with a "hard" material having a relatively high yield strength. For example, a soft material such as a gold wire is attached (e.g., by wire bonding) to a bond pad of a semiconductor device and is overcoated (e.g., by electrochemical plating) with a hard material such as nickel and its alloys.

Vis-a-vis overcoating the core, single and multi-layer overcoatings, "rough" overcoatings having microprotrusions (see also FIGS. 5C and 5D of the PARENT CASE), and overcoatings extending the entire length of or only a portion of the length of the core, are described. In the latter case, the tip of the core may suitably be exposed for making contact to an electronic component (see also FIG. 5B of the PARENT CASE).

Generally, throughout the description set forth herein, the term "plating" is used as exemplary of a number of techniques for overcoating the core. It is within the scope of this invention that the core can be overcoated by any suitable technique including, but not limited to: various processes involving deposition of materials out of aqueous solutions; electrolytic plating; electroless plating; chemical vapor deposition (CVD); physical vapor deposition (PVD); processes causing the disintegration of liquids, solids or gases; and the like, all of these techniques for depositing materials being generally well known.

Generally, for overcoating the core with a metallic material such as nickel, electrochemical processes are preferred, especially electroless plating.

In another embodiment of the invention, the core is an elongate element of a "hard" material, inherently suitable to functioning as a spring element, and is mounted at one end to a terminal of an electronic component. The core, and at least an adjacent area of the terminal, is overcoated with a material which will enhance anchoring the core to the terminal. In this manner, it is not necessary that the core be well-mounted to the terminal prior to overcoating, and processes which are less potentially damaging to the electronic component may be employed to "tack" the core in place for subsequent overcoating. These "friendly" processes include soldering, gluing, and piercing an end of the hard core into a soft portion of the terminal.

Embodiments wherein the core is a wire are disclosed. Embodiments wherein the core is a flat tab are also disclosed.

Representative materials, both for the core and for the overcoatings, are disclosed.

In the main hereinafter, techniques involving beginning with a relatively soft (low yield strength) core, which is generally of very small dimension (e.g., 2.0 mil or less) are described. Soft materials, such as gold, which attach easily to semiconductor devices, generally lack sufficient resiliency to function as springs. (Such soft, metallic materials exhibit primarily plastic, rather than elastic deformation.) Other soft materials which may attach easily to semiconductor devices and possess appropriate resiliency are often electrically non-conductive, as in the case of most elastomeric materials. In either case, desired structural and electrical characteristics can be imparted to the resulting composite interconnection element by the overcoating applied over the core. The resulting composite interconnection element can be made very small, yet can exhibit appropriate contact forces. Moreover, a plurality of such composite interconnection elements can be arranged at a fine pitch (e.g., 10 mils), even though the have a length (e.g., 100 mils) which is much greater than the pitch.

It is within the scope of this invention that composite interconnection elements can be fabricated on a microminiature scale, for example as "microsprings" for connectors and sockets, having cross-sectional dimensions on the order of twenty-five microns ($\mu$m), or less. This ability to manufacture reliable interconnection having dimensions measured in microns, rather than mils, squarely addresses the evolving needs of existing interconnection technology and future area array technology.

The composite interconnection elements of the present invention exhibit superior electrical characteristics, including electrical conductivity, solderability and low contact resistance. In many cases, deflection of the interconnection element in response to applied contact forces results in a "wiping" contact, which helps ensure that a reliable contact is made.

An additional advantage of the present invention is that connections made with the interconnection elements of the present invention are readily demountable. Soldering, to effect the interconnection to a terminal of an electronic component is optional, but is generally not preferred at a system level.

According to an aspect of the invention, techniques are described for making interconnection elements having controlled impedance. These techniques generally involve coating (e.g., electrophoretically) a conductive core or an entire composite interconnection element with a dielectric material (insulating layer), and overcoating the dielectric material with an outer layer of a conductive material. By grounding the outer conductive material layer, the resulting interconnection element can effectively be shielded, and its impedance can readily be controlled. (See also FIG. 10K of the PARENT CASE.)

According to an aspect of the invention, interconnection elements can be pre-fabricated as individual units, for later attachment to electronic components. Various techniques for accomplishing this objective are set forth herein. Although not specifically covered in this document, it is deemed to be relatively straightforward to fabricate a machine that will handle the mounting of a plurality of individual interconnection elements to a substrate or, alternatively, suspending a plurality of individual interconnection elements in an elastomer, or on a support substrate.

It should clearly be understood that the composite interconnection element of the present invention differs dramatically from interconnection elements of the prior art which have been coated to enhance their electrical conductivity characteristics or to enhance their resistance to corrosion.

The overcoating of the present invention is specifically intended to substantially enhance anchoring of the interconnection element to a terminal of an electronic component and/or to impart desired resilient characteristics to the resulting composite interconnection element. Stresses (contact forces) are directed to portions of the interconnection elements which are specifically intended to absorb the stresses.

One advantage of the invention is that the processes described herein are well-suited to "pre-fabricating" interconnection elements, particularly resilient interconnection elements, such as on a sacrificial member, then later mounting the interconnection elements to an electronic component. In contrast to fabricating the interconnection elements directly on the electronic component, this allows for reduced cycle time in processing the electronic components.

Additionally, yield issues which may be associated with the fabrication of the interconnection elements are thus disassociated from the electronic component. For example, it would be disingenuous for an otherwise perfectly good, relatively expensive integrated circuit device to be ruined by glitches in the process of fabricating interconnection elements mounted thereto. The mounting of pre-fabricated interconnection elements to electronic components is relatively straightforward, as is evident from the description set forth hereinbelow.

It should also be appreciated that the present invention provides essentially a new technique for making spring structures. Generally, the operative structure of the resulting spring is a product of plating, rather than of bending and shaping. This opens the door to using a wide variety of materials to establish the spring shape, and a variety of "friendly" processes for attaching the "falsework" of the core to electronic components. The overcoating functions as a "superstructure" over the "falsework" of the core, both of which terms have their origins in the field of civil engineering.

Other objects, features and advantages of the invention will become apparent in light of the following description thereof.

BRIEF DESCRIPTION OF THE DRAWINGS

Reference will now be made in detail to preferred embodiments of the invention, examples of which are illustrated in the accompanying drawings. Although the invention will be described in the context of these preferred embodiments, it should be understood that it is not intended to limit the spirit and scope of the invention to these particular embodiments.

FIG. 4A is a top plan view of a soft metal foil, in a preliminary step of making an interposer, according to the invention.

FIG. 4B is a cross-sectional view of the soft metal foil of FIG. 4A, in a subsequent process step, according to the invention.

FIG. 4C is a perspective view of the soft metal foil of FIG. 4A, in a subsequent process step, according to the invention.

FIG. 4D is a perspective view of the soft metal foil of FIG. 4A, in a subsequent process step, in use as an interposer between two electronic components, according to the invention.

DETAILED DESCRIPTION OF THE INVENTION

The disclosure of the aforementioned U.S. patent application Ser. No. 08/452,255, filed May 26, 1995 ("parent case") is incorporated by reference herein. This patent application summarizes several of the techniques disclosed therein.

An important aspect of the present invention is that a composite interconnection element can be formed by starting with a core (which may be mounted to a terminal of an electronic component), then overcoating the core with an appropriate material to: (1) establish the mechanical properties of the resulting composite interconnection element; and/or (2) when the interconnection element is mounted to a terminal of an electronic component, securely anchor the interconnection element to the terminal. In this manner, a resilient interconnection element (spring element) can be fabricated, starting with a core of a soft material which is readily shaped into a springable shape and which is readily attached to even the most fragile of electronic components. In light of prior art techniques of forming spring elements from hard materials, is not readily apparent, and is arguably counter-intuitive, that soft materials can form the basis of spring elements.

FIGS. 1A, 1B, 1C and 1D illustrate, in a general manner, various shapes for composite interconnection elements, according to the present invention.

In the main, hereinafter, composite interconnection elements which exhibit resiliency are described. However, it should be understood that non-resilient composite interconnection elements fall within the scope of the invention.

Further, in the main hereinafter, composite interconnection elements that have a soft (readily shaped, and amenable to affixing by friendly processes to electronic components) core, overcoated by hard (springy) materials are described. It is, however, within the scope of the invention that the core can be a hard material—the overcoat serving primarily to securely anchor the interconnection element to a terminal of an electronic component.

Figure 1A:
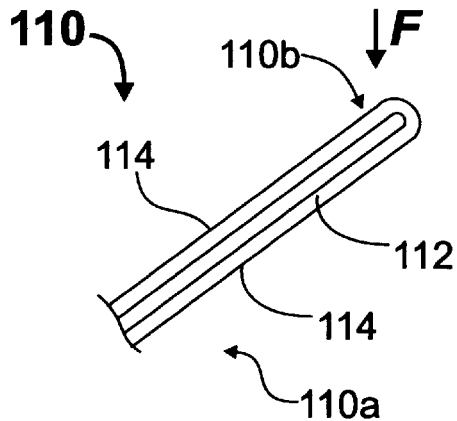
FIG. 1A is a cross-sectional view of a longitudinal portion, including one end, of an interconnection element, according to an embodiment of the invention.

In FIG. 1A, an electrical interconnection element 110 includes a core 112 of a "soft" material (e.g., a material having a yield strength of less than 40,000 psi), and a shell (overcoat) 114 of a "hard" material (e.g., a material having a yield strength of greater than 80,000 psi). The core 112 is an elongate element shaped (configured) as a substantially straight cantilever beam, and may be a wire having a diameter of 0.0005–0.0020 inches (0.001 inch=1 mil≈25 microns ($\mu$m)). The shell 114 is applied over the already-shaped core 112 by any suitable process, such as by a suitable plating process (e.g., by electrochemical plating).

FIG. 1A illustrates what is perhaps the simplest of spring shapes for an interconnection element of the present invention—namely, a straight cantilever beam oriented at an angle to a force "F" applied at its tip 110b. When such a force is applied by a terminal of an electronic component to which the interconnection element is making a pressure contact, the downward (as viewed) deflection of the tip will evidently result in the tip moving across the terminal, in a "wiping" motion. Such a wiping contact ensures a reliable contact being made between the interconnection element and the contacted terminal of the electronic component.

By virtue of its "hardness", and by controlling its thickness (0.00025–0.00500 inches), the shell 114 imparts a desired resiliency to the overall interconnection element 110. In this manner, a resilient interconnection between electronic components (not shown) can be effected between the two ends 110a and 110b of the interconnection element 110. (In FIG. 1A, the reference numeral 110a indicates an end portion of the interconnection element 110, and the actual end opposite the end 110b is not shown.) In contacting a terminal of an electronic component, the interconnection element 110 would be subjected to a contact force (pressure), as indicated by the arrow labelled "F".

The interconnection element (e.g., 110) will deflect in response to an applied contact force, said deflection (resiliency) being determined in part by the overall shape of the interconnection element, in part by the dominant (greater) yield strength of the overcoating material (versus that of the core), and in part by the thickness of the overcoating material.

Figure 1B:
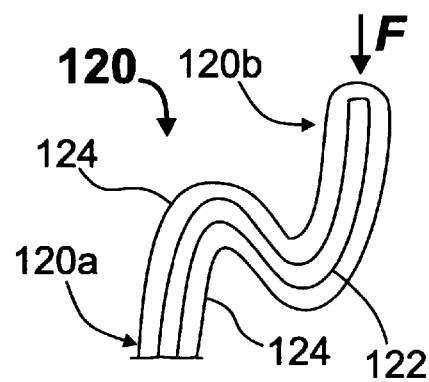
FIG. 1B is a cross-sectional view of a longitudinal portion, including one end, of an interconnection element, according to another embodiment of the invention.

In FIG. 1B, an electrical interconnection element 120 similarly includes a soft core 122 (compare 112) and a hard shell 124 (compare 114). In this example, the core 122 is shaped to have two bends, and thus may be considered to be S-shaped. As in the example of FIG. 1A, in this manner, a resilient interconnection between electronic components (not shown) can be effected between the two ends 120a and 120b of the interconnection element 120. (In FIG. 1B, reference numeral 120a indicates an end portion of the interconnection element 120, and the actual end opposite the end 120b is not shown.) In contacting a terminal of an electronic component, the interconnection element 120 would be subjected to a contact force (pressure), as indicated by the arrow labelled "F".

Figure 1C:
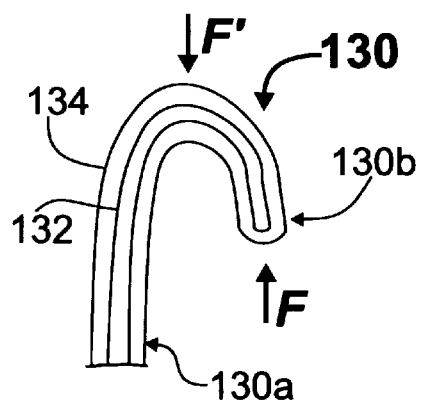
FIG. 1C is a cross-sectional view of a longitudinal portion, including one end of an interconnection element, according to another embodiment of the invention.

In FIG. 1C, an electrical interconnection element 130 similarly includes a soft core 132 (compare 112) and a hard shell 134 (compare 114). In this example, the core 132 is shaped to have one bend, and may be considered to be U-shaped. As in the example of FIG. 1A, in this manner, a resilient interconnection between electronic components (not shown) can be effected between the two ends 130a and 130b of the interconnection element 130. (In FIG. 1C, the reference numeral 130a indicates an end portion of the interconnection element 130, and the actual end opposite the end 130b is not shown.) In contacting a terminal of an electronic component, the interconnection element 130 could be subjected to a contact force (pressure), as indicated by the arrow labelled "F". Alternatively, the interconnection element 130 could be employed. to make contact at other than its end 130b, as indicated by the arrow labelled "F".

Figure 1D:
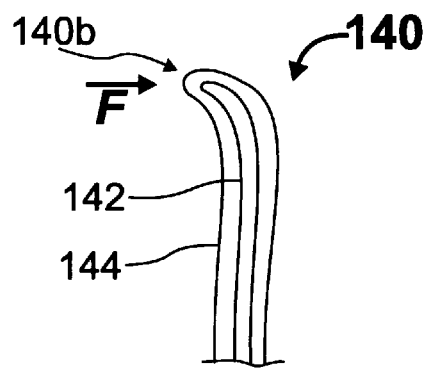
FIG. 1D is a cross-sectional view of a longitudinal portion, including one end of an interconnection element, according to another embodiment of the invention.

FIG. 1D illustrates another embodiment of a resilient interconnection element 140 having a soft core 142 and a hard shell 144. In this example, the interconnection element 140 is essentially a simple cantilever (compare FIG. 1A), with a curved tip 140b, subject to a contact force "F" acting transverse to its longitudinal axis.

Figure 1E:
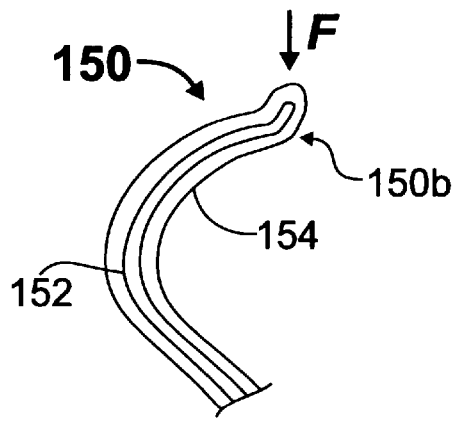
FIG. 1E is a cross-sectional view of a longitudinal portion, including one end of an interconnection element, according to another embodiment of the invention.

FIG. 1E illustrates another embodiment of a resilient interconnection element 150 having a soft core 152 and a hard shell 154. In this example, the interconnection element 150 is generally "C-shaped", preferably with a slightly curved tip 150b, and is suitable for making a pressure contact as indicated by the arrow labelled "F".

It should be understood that the soft core can readily be formed into any springable shape—in other words, a shape that will cause a resulting interconnection element to deflect resiliently in response to a force applied at its tip. For example, the core could be formed into a conventional coil shape. However, a coil shape would not be preferred, due to the overall length of the interconnection element and inductances (and the like) associated therewith and the adverse effect of same on circuitry operating at high frequencies (speeds).

The material of the shell, or at least one layer of a multi-layer shell (described hereinbelow) has a significantly higher yield strength than the material of the core. Therefore, the shell overshadows the core in establishing the mechanical characteristics (e.g., resiliency) of the resulting interconnection structure. Ratios of shell:core yield strengths are preferably at least 2:1, including at least 3:1 and at least 5:1, and may be as high as 10:1. It is also evident that the shell, or at least an outer layer of a multi-layer shell should be electrically conductive, notably in cases where the shell covers the end of the core. (The parent case, however, describes embodiments where the end of the core is exposed, in which case the core must be conductive.)

From an academic viewpoint, it is only necessary that the springing (spring shaped) portion of the resulting composite interconnection element be overcoated with the hard material. From this viewpoint, it is generally not essential that both of the two ends of the core be overcoated. As a practical matter, however, it is preferred to overcoat the entire core. Particular reasons for and advantages accruing to overcoating an end of the core which is anchored (attached) to an electronic component are discussed in greater detail hereinbelow.

Suitable materials for the core (112, 122, 132, 142) include, but are not limited to: gold, aluminum, copper, and their alloys. These materials are typically alloyed with small amounts of other metals to obtain desired physical properties, such as with beryllium, cadmium, silicon, magnesium, and the like. It is also possible to use silver, palladium, platinum; metals or alloys such as metals of the platinum group of elements. Solder constituted from lead, tin, indium, bismuth, cadmium, antimony and their alloys can be used.

Vis-a-vis attaching an end of the core (wire) to a terminal of an electronic component (discussed in greater detail hereinbelow), generally, a wire of any material (e.g., gold) that is amenable to bonding (using temperature, pressure and/or ultrasonic energy to effect the bonding) would be suitable for practicing the invention. It is within the scope of this invention that any material amenable to overcoating (e.g., plating), including non-metallic material, can be used for the core.

Suitable materials for the shell (114, 124, 134, 144) include (and, as is discussed hereinbelow, for the individual layers of a multi-layer shell), but are not limited to: nickel, and its alloys; copper, cobalt, iron, and their alloys; gold (especially hard gold) and silver, both of which exhibit excellent current-carrying capabilities and good contact resistivity characteristics; elements of the platinum group; noble metals; semi-noble metals and their alloys, particularly elements of the platinum group and their alloys; tungsten and molybdenum. In cases where a solder-like finish is desired, tin, lead, bismuth, indium and their alloys can also be used.

The technique selected for applying these coating materials over the various core materials set forth hereinabove will, of course, vary from application-to-application. Electroplating and electroless plating are generally preferred techniques. Generally, however, it would be counterintuitive to plate over a gold core. According to an aspect of the invention, when plating (especially electroless plating) a nickel shell over a gold core, it is desirable to first apply a thin copper initiation layer over the gold wire stem, in order to facilitate plating initiation.

An exemplary interconnection element, such as is illustrated in FIGS. 1A–1E may have a core diameter of approximately 0.001 inches and a shell thickness of 0.001 inches the interconnection element thus having an overall diameter of approximately 0.003 inches (i.e., core diameter plus two times the shell thickness). Generally, this thickness of the shell will be on the order of 0.2–5.0 (one-fifth to five) times the thickness (e.g., diameter) of the core.

Some exemplary parameters for composite interconnection elements are:

(a) A gold wire core having a diameter of 1.5 mils is shaped to have an overall height of 40 mils and a generally C-shape curve (compare FIG. 1E) of 9 mils radius, is plated with 0.75 mils of nickel (overall diameter=1.5+2×0.75=3 mils), and optionally receives a final overcoat of 50 microinches of gold (e.g., to lower and enhance contact resistance). The resulting composite interconnection element exhibits a spring constant (k) of approximately 3–5 grams/mil. In use, 3–5 mils of deflection will result in a contact force of 9–25 grams. This example is useful in the context of a spring element for an interposer.

(b) A gold wire core having a diameter of 1.0 mils is shaped to have an overall height of 35 mils and a curved cantilever shape, is plated with 1.25 mils of nickel (overall diameter=1.0+2×1.25=3.5 mils), and optionally receives a final overcoat of 50 microinches of gold. The resulting composite interconnection element exhibits a spring constant (k) of approximately 3 grams/mil, and is useful in the context of a spring element for a probe.

(c) A gold wire core having a diameter of 1.5 mils is shaped to have an overall height of 20 mils and a generally S-shape curve with radii of approximately 5 mils, is plated with 0.75 mils of nickel or copper (overall diameter=1.5+ 2×0.75=3 mils). The resulting composite interconnection element exhibits a spring constant (k) of approximately 2–3 grams/mil, and is useful in the context of a spring element for mounting on a semiconductor device.

As will be illustrated in greater detail hereinbelow, the core need not have a round cross-section, but may rather be a flat tab (having a rectangular cross-section) extending from a sheet. It should be understood that, as used herein, the term "tab" is not to be confused with the term "TAB" (Tape Automated Bonding).

MULTI-LAYER SHELLS

Figure 2A:
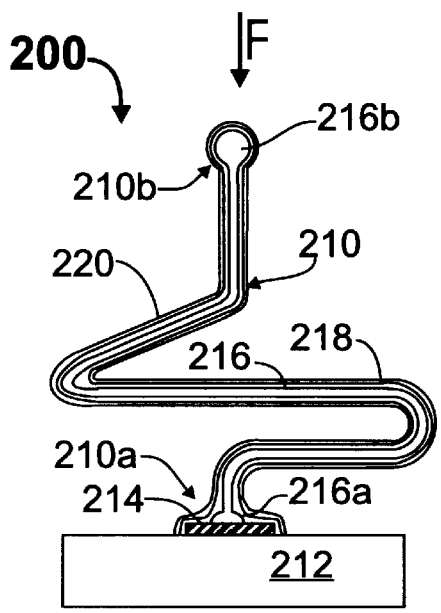
FIG. 2A is a cross-sectional view of an interconnection element mounted to a terminal of an electronic component and having a multi-layered shell, according to the invention.

FIG. 2A illustrates an embodiment 200 of an interconnection element 210 mounted to an electronic component 212 which is provided with a terminal 214. In this example, a soft (e.g., gold) wire core 216 is bonded (attached) at one end 216a to the terminal 214, is configured to extend from the terminal and have a spring shape (compare the shape shown in FIG. 1B), and is severed to have a free end 216b. Bonding, shaping and severing a wire in this manner is accomplished using wirebonding equipment. The bond at the end 216a of the core covers only a relatively small portion of the exposed surface of the terminal 214.

A shell is disposed over the wire core 216 which, in this example, is shown as being multi-layered, having an inner layer 218 and an outer layer 220, both of which layers may suitably be applied by plating processes. One or more layers of the multi-layer shell is (are) formed of a hard material (such as nickel and its alloys) to impart a desired resiliency to the interconnection element 210. For example, the outer layer 220 may be of a hard material, and the inner layer may be of a material that acts as a buffer or barrier layer (or as an activation layer, or as an adhesion layer) in plating the hard material 220 onto the core material 216. Alternatively, the inner layer 218 may be the hard material, and the outer layer 220 may be a material (such as soft gold) that exhibits superior electrical characteristics, including electrical conductivity and solderability. When a solder or braze type contact is desired, the outer layer of the interconnection element may be lead-tin solder or gold-tin braze material, respectively.

ANCHORING TO A TERMINAL

FIG. 2A illustrates, in a general manner, another key feature of the invention—namely, that resilient interconnection element can be securely anchored to a terminal on an electronic component. The attached end 210a of the interconnection element will be subject to significant mechanical stress, as a result of a compressive force (arrow "F") applied to the free end 210b of the interconnection element.

As illustrated in FIG. 2A, the overcoat (218, 220) covers not only the core 216, but also the entire remaining (i.e., other than the bond 216a) exposed surface of the terminal 214 adjacent the core 216 in a continuous (non-interrupted) manner. This securely and reliably anchors the interconnection element 210 to the terminal, the overcoat material providing a substantial (e.g., greater than 50%) contribution to anchoring the resulting interconnection element to the terminal. Generally, it is only required that the overcoat material cover at least a portion of the terminal adjacent the core. It is generally preferred, however, that the overcoat material cover the entire remaining surface of the terminal. Preferably, each layer of the shell is metallic.

As a general proposition, the relatively small area at which the core is attached (e.g., bonded) to the terminal is not well suited to accommodating stresses resulting from contact forces ("F") imposed on the resulting composite interconnection element. By virtue of the shell covering the entire exposed surface of the terminal (other than in the relatively small area comprising the attachment of the core end 216a to the terminal), the overall interconnection structure is firmly anchored to the terminal. The adhesion strength, and ability to react contact forces, of the overcoat will far exceed that of the core end (216a) itself.

As used herein, the term "electronic component" (e.g., 212) includes, but is not limited to: interconnect and interposer substrates; semiconductor wafers and dies, made of any suitable semiconducting material such as silicon (Si) or gallium-arsenide (GaAs); production interconnect sockets; test sockets; sacrificial members, elements and substrates, as described in the parent case; semiconductor packages, including ceramic and plastic packages, and chip carriers; and connectors.

The interconnection element of the present invention is particularly well suited for use as:
  interconnection elements mounted directly to silicon dies, eliminating the need for having a semiconductor package;
  interconnection elements extending as probes from substrates (described in greater detail hereinbelow) for testing electronic components; and
  interconnection elements of interposers (discussed in greater detail hereinbelow).

The interconnection element of the present invention is unique in that it benefits from the mechanical characteristics (e.g., high yield strength) of a hard material without being limited by the attendant typically poor bonding characteristic of hard materials. As elaborated upon in the parent case, this is made possible largely by the fact that the shell (overcoat) functions as a "superstructure" over the "falsework" of the core, two terms which are borrowed from the milieu of civil engineering. This is very different from plated interconnection elements of the prior art wherein the plating is used as a protective (e.g., anti-corrosive) coating, and is generally incapable of imparting the desired mechanical characteristic to the interconnection structure. And this is certainly in marked contrast to any non-metallic, anticorrosive coatings, such as benzotriazole (BTA) applied to electrical interconnects.

Among the numerous advantages of the present invention are that a plurality of free-standing interconnect structures are readily formed on substrates, from different levels thereof such as a PCB having a decoupling capacitor) to a common height above the substrate, so that their free ends are coplanar with one another. Additionally, both the electrical and mechanical (e.g., plastic and elastic) characteristics of an interconnection element formed according to the invention are readily tailored for particular applications. For example, it may be desirable in a given application that the interconnection elements exhibit both plastic and elastic deformation. (Plastic deformation may be desired to accommodate gross non-planarities in components being interconnected by the interconnection elements.) When elastic behavior is desired, it is necessary that the interconnection element generate a threshold minimum amount of contact force to effect a reliable contact. It is also advantageous that the tip of the interconnection element makes a wiping contact with a terminal of an electronic component, due to the occasional presence of contaminant films on the contacting surfaces.

A number of features are elaborated upon in detail, in the parent case, including, but not limited to: fabricating the interconnection elements on sacrificial substrates; gang-transferring a plurality of interconnection elements to an electronic component; providing the interconnection elements with contact tips, preferably with a rough surface finish; employing the interconnection elements on an electronic component to make temporary, then permanent connections to the electronic component; arranging the interconnection elements to have different spacing at their one ends than at their opposite ends; fabricating spring clips and alignment pins in the same process steps as fabricating the interconnection elements; employing the interconnection elements to accommodate differences in thermal expansion between connected components; eliminating the need for discrete semiconductor packages (such as for SIMMs); and optionally soldering resilient interconnection elements (resilient contact structures).

Controlled Impedance

Figure 2B:
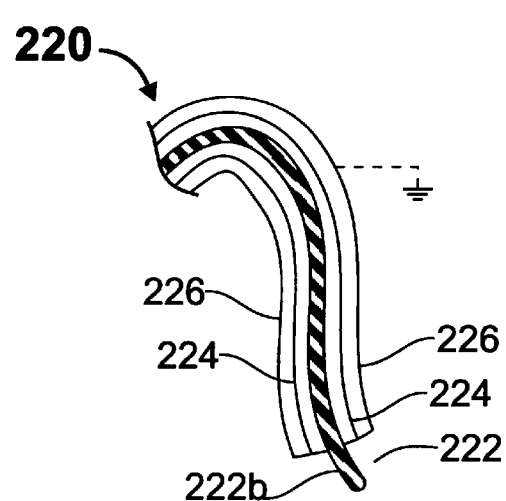
FIG. 2B is a cross-sectional view of an interconnection element having a multi-layered shell, wherein an intermediate layer is of a dielectric material, according to the invention.

FIG. 2B shows a composite interconnection element 220 having multiple layers. An innermost portion (inner elongate conductive element) 222 of the interconnection element 220 is either an uncoated core or a core which has been overcoated, as described hereinabove. The tip 222b of the innermost portion 222 is masked with a suitable masking material (not shown). A dielectric layer 224 is applied over the innermost portion 222 such as by an electrophoretic process. An outer layer 226 of a conductive material is applied over the dielectric layer 224.

In use, electrically grounding the outer layer 226 will result in the interconnection element 220 having controlled impedance. An exemplary material for the dielectric layer 224 is a polymeric material, applied in any suitable manner and to any suitable thickness (e.g., 0.1–3.0 mils).

The outer layer 226 may be multi-layer. For example, in instances wherein the innermost portion 222 is an uncoated core, at least one layer of the outer layer 226 is a spring material, when it is desired that the overall interconnection element exhibit resilience.

Probe Card Insert

Figure 2C:
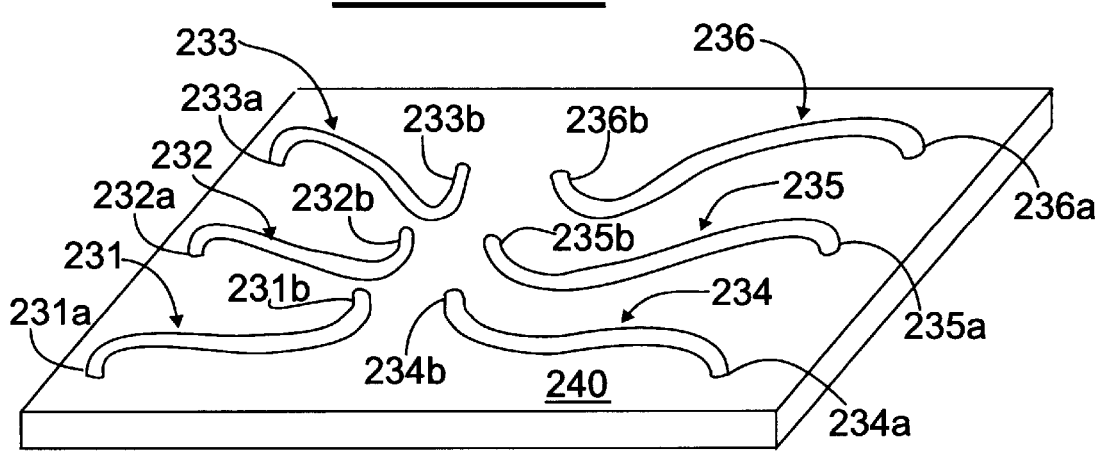
FIG. 2C is a perspective view of a plurality of interconnection elements mounted to an electronic component (e.g., a probe card insert), according to the invention.

FIG. 2C illustrates an embodiment 230 wherein a plurality (six of many shown) of interconnection elements 231 . . . 236 are mounted on a surface of an electronic component 240, such as a probe card insert (a subassembly mounted in a conventional manner to a probe card). Terminals and conductive traces of the probe card insert are omitted from this view, for illustrative clarity. The attached ends 231a . . . 236a of the interconnection elements 231 . . . 236 originate at a first pitch (spacing), such as a 0.010 inches. The interconnection elements 231 . . . 236 are shaped and/or oriented so that their free ends (tips) are at a second, finer pitch, such as 0.005 inches. An interconnect assembly which makes interconnections from a one pitch to another pitch is typically referred to as a "space transformer".

As illustrated, the tips 231b . . . 236b of the interconnection elements are arranged in two parallel rows, such as for making contact to (for testing and/or burning in) a semiconductor device having two parallel rows of bond pads (contact points). The interconnection elements can be arranged to have other tip patterns, for making contact to electronic components having other contact point patterns, such as arrays.

Generally, throughout the embodiments disclosed herein, although only one interconnection element may be shown, the invention is applicable to fabricating a plurality of interconnection components and arranging the plurality of interconnection elements in a prescribed spatial relationship with one another, such as in a peripheral pattern or in a rectangular array pattern.

USE OF SACRIFICIAL SUBSTRATES

The mounting of interconnection elements directly to terminals of electronic components has been discussed hereinabove. Generally speaking, the interconnection elements of the present invention can be fabricated upon, or mounted to, any suitable surface of any suitable substrate, including sacrificial substrates.

Attention is directed to the PARENT CASE, which describes, for example with respect to FIGS. 11A–11F fabricating a plurality of interconnection structures (e.g., resilient contact structures) as separate and distinct structures for subsequent mounting to electronic components, and which describes with respect to FIGS. 12A–12C mounting a plurality of interconnection elements to a sacrificial substrate (carrier) then transferring the plurality of interconnection elements en masse to an electronic component.

Figure 2D:
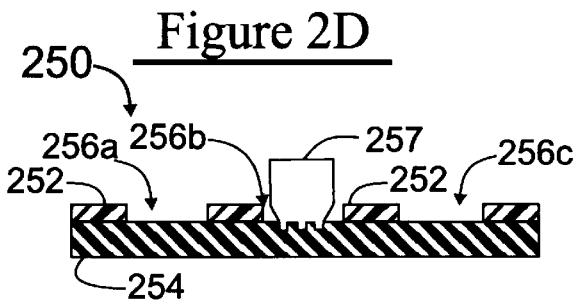
FIG. 2D is a cross-sectional view of an exemplary first step of a technique for manufacturing interconnection elements, according to the invention.
Figure 2E:
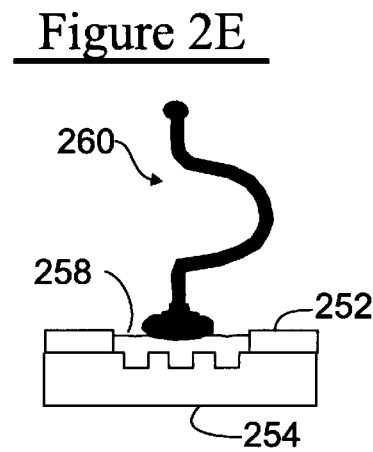
FIG. 2E is a cross-sectional view of an exemplary further step of the technique of FIG. 2D for manufacturing interconnection elements, according to the invention.
Figure 2F:
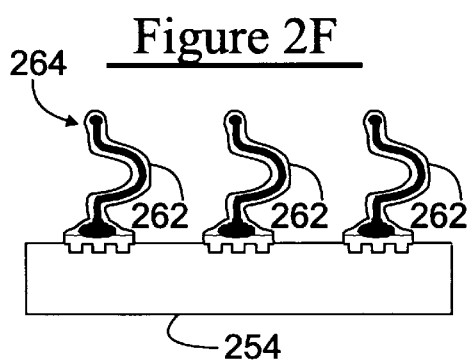
FIG. 2F is a cross-sectional view of an exemplary further step of the technique of FIG. 2E for manufacturing interconnection elements, according to the invention.

FIGS. 2D–2F illustrate a technique for fabricating a plurality of interconnection elements having preformed tip structures, using a sacrificial substrate.

FIG. 2D illustrates a first step of the technique 250, in which a patterned layer of masking material 252 is applied onto a surface of a sacrificial substrate 254. The sacrificial substrate 254 may be of thin (1–10 mil) copper or aluminum foil, by way of example, and the masking material 252 may be common photoresist. The masking layer 252 is patterned to have a plurality (three of many shown) of openings at locations 256a, 256b, 256c whereat it is desired to fabricate interconnection elements. The locations 256a, 256b and 256c are, in this sense, comparable to the terminals of an electronic component. The locations 256a, 256b and 256c are preferably treated at this stage to have a rough or featured surface texture. As shown, this may be accomplished mechanically with an embossing tool 257 forming depressions in the foil 254 at the locations 256a, 256b and 256c. Alternatively, the surface of the foil at these locations can be chemically etched to have a surface texture. Any technique suitable for effecting this general purpose is within the scope of this invention, for example sand blasting, peening and the like.

Next, a plurality (one of many shown) of conductive tip structures 258 are formed at each location (e.g., 256b), as illustrated by FIG. 2E. This may be accomplished using any suitable technique, such as electroplating, and may include tip structures having multiple layers of material. For example, the tip structure 258 may have a thin (e.g., 10–100 microinch) barrier layer of nickel applied onto the sacrificial substrate, followed by a thin (e.g., 10 microinch) layer of soft gold, followed by a thin (e.g., 20 microinch) layer of hard gold, followed by a relatively thick (e.g., 200 microinch) layer of nickel, followed by a final thin (e.g., 100 microinch) layer of soft gold. Generally, the first thin barrier layer of nickel is provided to protect the subsequent layer of gold from being "poisoned" by the material (e.g., aluminum, copper) of the substrate 254, the relatively thick layer of nickel is to provide strength to the tip structure, and the final thin layer of soft gold provides a surface which is readily bonded to. The invention is not limited to any particulars of how the tip structures are formed on the sacrificial substrate, as these particulars would inevitably vary from application-to-application.

As illustrated by FIG. 2E, a plurality (one of many shown) of cores 260 for interconnection elements may be formed on the tip structures 258, such as by any of the techniques of bonding a soft wire core to a terminal of an electronic component described hereinabove. The cores 260 are then overcoated with a preferably hard material 262 in the manner described hereinabove, and the masking material 252 is then removed, resulting in a plurality (three of many shown) of free-standing interconnection elements 264 mounted to a surface of the sacrificial substrate, as illustrated by FIG. 2F.

In a manner analogous to the overcoat material covering at least the adjacent area of a terminal (214) described with respect to FIG. 2A, the overcoat material 262 firmly anchors the cores 260 to their respective tip structures 258 and, if desired, imparts resilient characteristics to the resulting interconnection elements 264. As noted in the PARENT CASE, the plurality of interconnection elements mounted to the sacrificial substrate may be gang-transferred to terminals of an electronic component. Alternatively, two widely divergent paths may be taken.

Figure 2G:
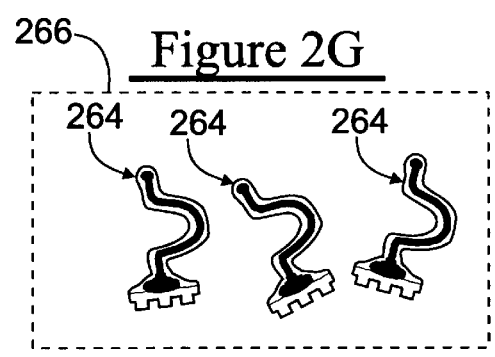
FIG. 2G is a cross-sectional view of an exemplary plurality of individual interconnection elements fabricated according to the technique of FIGS. 2D–2F, according to the invention.

As illustrated by FIG. 2G, the sacrificial substrate 254 may simply be removed, by any suitable process such as selective chemical etching. Since most selective chemical etching processes will etch one material at a much greater rate than an other material, and the other material may slightly be etched in the process, this phenomenon is advantageously employed to remove the thin barrier layer of nickel in the tip structure contemporaneously with removing the sacrificial substrate. However, if need be, the thin nickel barrier layer can be removed in a subsequent etch step. This results in a plurality (three of many shown) of individual, discrete, singulated interconnection elements 264, as indicated by the dashed line 266, which may later be mounted (such as by soldering or brazing) to terminals on electronic components.

It bears mention that the overcoat material may also be slightly thinned in the process of removing the sacrificial substrate and/or the thin barrier layer. However, it is preferred that this not occur.

To prevent thinning of the overcoat, it is preferred that a thin layer of gold or, for example, approximately 10 microinches of soft gold applied over approximately 20 microinches of hard gold, be applied as a final layer over the overcoat material 262. Such an outer layer of gold is intended primarily for its superior conductivity, contact resistance, and solderability, and is generally highly impervious to most etching solutions contemplated to be used to remove the thin barrier layer and the sacrificial substrate.

Figure 2H:
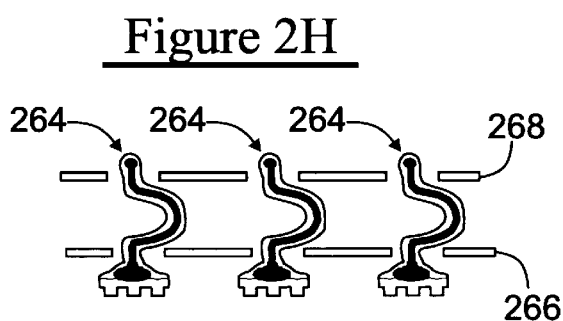
FIG. 2H is a cross-sectional view of an exemplary plurality of interconnection elements fabricated according to the technique of FIGS. 2D–2F, and associated in a prescribed spatial relationship with one another, according to the invention.

Alternatively, as illustrated by FIG. 2H, prior to removing the sacrificial substrate 254, the plurality (three of many shown) of interconnection elements 264 may be "fixed" in a desired spatial relationship with one another by any suitable support structure 266, such as by a thin plate having a plurality of holes therein, whereupon the sacrificial substrate is removed. The support structure 266 may be of a dielectric material, or of a conductive material overcoated with a dielectric material. Further processing steps (not illustrated) such as mounting the plurality of interconnection elements to an electronic component such as a silicon wafer or a printed circuit board may then proceed. Additionally, in some applications, it may be desireable to stabilize the tips (opposite the tip structures) of the interconnection elements 264 from moving, especially when contact forces are applied thereto. To this end, it may also be desirable to constrain movement of the tips of the interconnection elements with a suitable sheet 268 having a plurality of holes, such as a mesh formed of a dielectric material.

A distinct advantage of the technique 250 described hereinabove is that tip structures (258) may be formed of virtually any desired material and having virtually any desired texture. As mentioned hereinabove, gold is an example of a noble metal that exhibits excellent electrical characteristics of electrical conductivity, low contact resistance, solderability, and resistance to corrosion. Since gold is also malleable, it is extremely well-suited to be a final overcoat applied over any of the interconnection elements described herein, particularly the resilient interconnection elements described herein. Other noble metals exhibit similar desirable characteristics. However, certain materials such as rhodium which exhibit such excellent electrical characteristics would generally be inappropriate for overcoating an entire interconnection element. Rhodium, for example, is notably brittle, and would not perform well as a final overcoat on a resilient interconnection element. In this regard, techniques exemplified by the technique 250 readily over come this limitation. For example, the first layer of a multi-layer tip structure (see 258) can be rhodium (rather than gold, as described hereinabove), thereby exploiting its superior electrical characteristics for making contact to electronic components without having any impact whatsoever on the mechanical behavior of the resulting interconnection element.

Figure 2I:
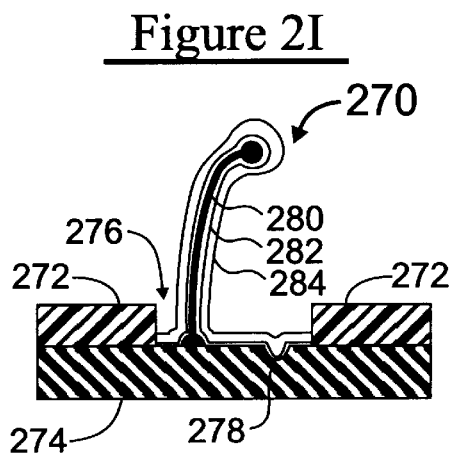
FIG. 2I is a cross-sectional view of an alternate embodiment for manufacturing interconnection elements, according to the invention.

FIG. 2I illustrates an alternate embodiment 270 for fabricating interconnection elements. In this embodiment, a masking material 272 is applied to the surface of a sacrificial substrate 274, and is patterned to have a plurality (one of many shown) of openings 276, in a manner similar to the technique described hereinabove with respect to FIG. 2D. The openings 276 define areas whereat interconnection elements will be fabricated as free-standing structures. (As used throughout the descriptions set forth herein, an interconnection element is "free-standing" when is has a one end bonded to a terminal of an electronic component or to an area of a sacrificial substrate, and the opposite end of the interconnection element is not bonded to the electronic component or sacrificial substrate.)

The area within the opening may be textured, in any suitable manner, such as to have one or more depressions, as indicated by the single depression 278 extending into the surface of the sacrificial substrate 274.

A core (wire stem) 280 is bonded to the surface of the sacrificial substrate within the opening 276, and may have any suitable shape. In this illustration, the shape of the core 280 is similar to that which was illustrated in FIG. 1D, hereinabove. It may now readily be observed that the technique 270 differs from the aforementioned technique 250 in that the core 280 is bonded directly to the sacrificial substrate 274, rather than to a tip structure 258. By way of example, a gold wire core (280) is readily bonded, using conventional wirebonding techniques, to the surface of an aluminum substrate (274).

In a next step of the process (270), a layer 282 of gold is applied (e.g., by plating) over the core 280 and onto the exposed area of the substrate 274 within the opening 276, including within the depression 278. The primary purpose of this layer 282 is to form a contact surface at the end of the resulting interconnection element (i.e., once the sacrificial substrate is removed).

Next, a layer 284 of a relatively hard material, such as nickel, is applied over the layer 282. As mentioned hereinabove, one primary purpose of this layer 284 is to impart desired mechanical characteristics (e.g., resiliency) to the resulting composite interconnection element. In this embodiment, another primary purpose of the layer 284 is to enhance the durability of the contact surface being fabricated at the lower (as viewed) end of the resulting interconnection element. A final layer of gold (not shown) may be applied over the layer 284, to enhance the electrical characteristics of the resulting interconnection element.

In a final step, the masking material 272 and sacrificial substrate 274 are removed, resulting in either a plurality of singulated interconnection elements (compare FIG. 2G) or in a plurality of interconnection elements having a predetermined spatial relationship with one another (compare FIG. 2H).

This embodiment 270 is exemplary of a technique for fabricating textured contact tips on the ends of interconnection elements. In this case, an excellent example of a "gold over nickel" contact tip has been described. It is, however, within the scope of the invention that other analogous contact tips could be fabricated at the ends of interconnection elements, according to the techniques described herein. Another feature of this embodiment 270 is that the contact tips are constructed entirely atop the sacrificial substrate (274), rather than within the surface of the sacrificial substrate (254) as contemplated by the previous embodiment 250.

INTERPOSERS

The subject of using the interconnection elements of the invention in interposers has been mentioned hereinabove. Generally, as used herein, an "interposer" is a substrate having contacts on two opposite surfaces thereof, disposed between two electronic components to interconnect the two electronic components. Often, it is desirable that the interposer permit at least one of the two interconnected electronic components to be removed (e.g., for replacement, upgrading, and the like).

INTERPOSER EMBODIMENT #1

Figure 3A:
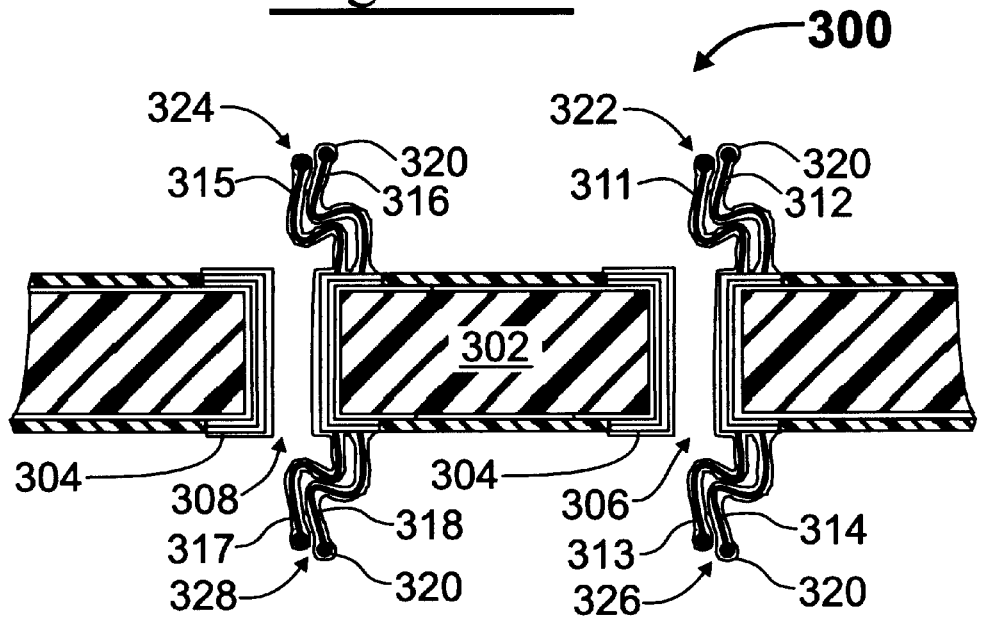
FIG. 3A is a cross-sectional view of an embodiment of an interposer, according to the invention.

FIG. 3A illustrates an embodiment 300 of an interposer, using the interconnection elements of the invention.

Generally, an insulating substrate 302, such as a PCB-type substrate, is provided with a plurality (two of many shown) of electrically conductive through holes (e.g., plated vias) 306, 308, or the like, each having conductive portions exposed on the top (upper) 302a and bottom (lower) 302b surfaces of the insulating substrate 302.

A pair of soft cores 311 and 312 are attached to the exposed portion of the through hole 306 on the top surface 302a of the substrate 302. A pair of soft cores 313 and 314 are attached to the exposed portion of the through hole 306 on the bottom surface of the substrate 302. Similarly, a pair of soft cores 315 and 316 are attached to the exposed portion of the through hole 308 on the top surface of the substrate 302, and a pair of soft cores 317 and 318 are attached to the exposed portion of the through hole 308 on the bottom surface of the substrate 302. The cores 311 . . . 318 are then overcoated with a hard material 320 to form interconnect structures 322 and 324 on the top surface 302a of the substrate 302 and to form interconnect structures 326 and 328 on the bottom surface 302b of the substrate 302. In this manner, the individual cores 311 . . . 318 are securely anchored to the respective exposed portions of the through holes, the interconnecting structure 322 is electrically connected to the interconnecting structure 326, and the interconnecting structure 324 is electrically connected to the interconnecting structure 328. It will be understood that by providing each interconnecting structure (e.g., 322) as a pair of interconnecting elements (e.g., 311, 312), that more reliable connections to external components (not shown) are effected (i.e., than with single interconnecting elements).

As is shown, the top group of interconnection elements 311, 312, 315 and 316 are all formed with the same shape, and the bottom group of interconnection elements all have the same shape. It should be understood that the bottom group of interconnection elements can be provided with a shape which is different than the top group of interconnection elements, which would provide the opportunity to create interconnecting structures extending from the top surface of the insulating substrate having dissimilar mechanical characteristics from the interconnecting structures extending from the bottom surface of the substrate.

INTERPOSER EMBODIMENT #2

Figure 3B:
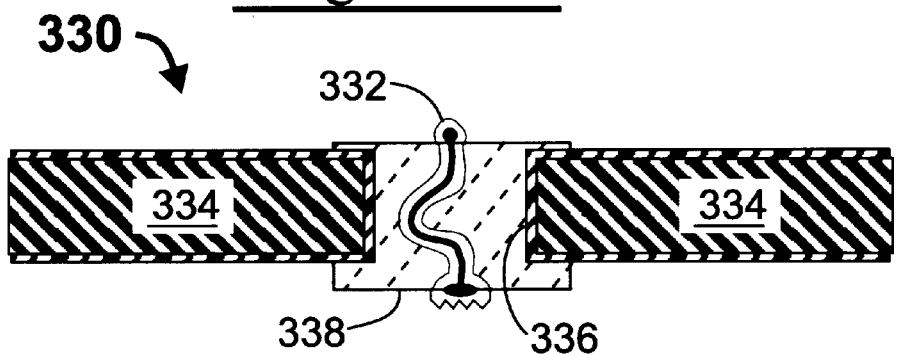
FIG. 3B is a cross-sectional view of another embodiment of an interposer, according to the invention.

FIG. 3B illustrates another embodiment 330 of an interposer using the interconnection elements of the invention. In this embodiment, a plurality (one of many shown) of interconnection elements 332 are fabricated in a desired pattern (e.g., an array) on a sacrificial substrate (not shown). A support substrate 334 is provided with a like plurality of holes 336 in a corresponding pattern. The support substrate 334 is placed over the interconnection elements 332 so that the interconnection elements 332 extend through the holes 336. The interconnection elements 332 are loosely held within the support substrate by a suitable material 338 (such as an elastomer) filling the holes 336, and extend from both the top and bottom surfaces of the support substrate. The sacrificial substrate is then removed. Evidently, the support substate 334 (compare 266) can simply be "dropped" onto a plurality of interconnection elements (compare 264) which are mounted to a sacrificial substrate (254) in the process of fabricating this interposer assembly.

INTERPOSER EMBODIMENT #3

Figure 3C:
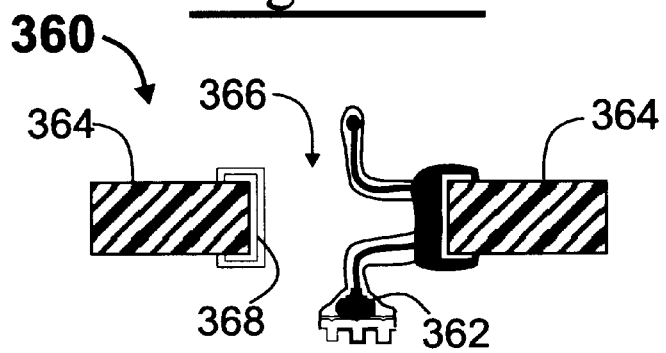
FIG. 3C is a cross-sectional view of another embodiment of an interposer, according to the invention.

FIG. 3C illustrates another embodiment 360 of an interposer using the interconnection elements of the invention. This embodiment 360 is similar to the previously-described embodiment 330, with the exception that the interconnect structure 362 (compare 332) is supported within the holes 366 (compare 336) of the support substrate 364 (compare 334) by soldering middle portions of the interconnection structures 362 to plating 368 on the through holes 366 the support substrate. Again, the support substrate 364 (compare 266) can simply be "dropped" onto a plurality of interconnection elements (compare 264) which are mounted to a sacrificial substrate (254) in the process of fabricating this interposer assembly.

FIGS. 3B and 3C are illustrative of the fact that a single interconnection element (332, 362) can be used to effect a single connection of respective terminals of two electronic components. It should be understood, and is within the scope of this invention, that any conductive element could be used in lieu of the interconnection element of the present invention, as illustrated by FIGS. 3B and 3C.

It should be understood that, in the interposer embodiments of FIGS. 3A, 3B and 3C, electronic components (not shown) would be disposed on both sides of the interposer (300, 330, 360) in order that the interposer make electrical connection between terminals (not shown) thereof.

FORMING INTERCONNECTION ELEMENTS FROM SHEETS

The discussion hereinabove has focused mainly on forming interconnection elements from soft wire cores which are shaped and overcoated with a hard material. The present invention is also applicable to forming interconnection elements which are formed of soft metal sheets which are patterned (such as by stamping or etching) and overcoated with a hard material.

Prior art efforts directed to forming connecting structures, deformable in the vertical direction, from flat metallic layers of springy material are illustrated, for example, in U.S. Pat. No. 4,893,172 ("MATSUMOTO"). Matsumoto discloses spiral conductive flat springs fabricated on an insulation sheet. The inner end of each spring is in alignment with a hole through the insulation sheet which corresponds to a position of a chip electrode (32), to which it is soldered (31). The outer end of each spring is secured to the insulation sheet, and is connected to a substrate electrode (42) by solder (41).

MATSUMOTO's springs are manufactured by adhering a thin, flat spring material (copper, a copper alloy, or a composite metal of copper) to an insulating sheet (polyimide resin, glass, epoxy resin, glass-polyimide resin, polyester resin, polyimide resin containing quartz fiber, or a polyimide, epoxy or polyester resin containing carbon fiber). Next, holes, each of which are larger than the spiral portion of yet-to-be-formed conductive flat springs are formed on the insulation sheet material. Next, the flat spring material is formed into a spiral shape by photoetching. Finally, the conductive flat springs are soldered to the respective chip electrodes (32) and the substrate electrodes (42). Certain alternatives to this process sequence are set forth in MATSUMOTO (see, e.g., column 4, lines 27–36), including thermocompression bonding, brazing or welding in place of soldering. The preferable dimensional range of each spring is set forth as 10–40 μm in thickness, and 40–70 μm in width (diameter). The spring structure set forth in MATSUMOTO establishes an inherently long conductive path between the interconnected electrodes (32, 42) which, as mentioned hereinabove is not desirable in many applications. Additionally, increased travel in the vertical direction (with a given spring constant) necessitates a larger diameter spiral spring. Moreover, Matsumoto's apparatus establishes only a single spring constant, per spiral spring, for the overall interconnection between the electrodes.

As is evident from the above, the present invention is amenable to establishing a first spring constant for the composite interconnection elements (overcoated cores) projecting upward to connect to a first electronic component, and establishing a second spring constant, dissimilar from the first spring constant, for the composite interconnection elements (overcoated cores) projecting downward to connect to a second electronic component (see, e.g., FIG. 3A). Generally, for a given overcoat, and in the context of overcoating all cores simultaneously, the disparate spring rates are readily established by tailoring the physical characteristics (e.g., thickness, shape, etc.) of the core element. This concept is carried forward to the cantilever embodiments set forth hereinbelow.

CANTILEVER EMBODIMENT #1

FIGS. 4A, 4B, 4C and 4D illustrates a technique for making an interposer, according to the present invention. In FIG. 4A, it is shown that a flat, thin (such as 0.001–0.005 inches) sheet 402 of soft metal (e.g., gold, soft copper alloy, soft aluminum alloy) is patterned (such as by punching or etching) to define the outlines of a plurality (two of many shown) of elongate elements 404, 406 described therein. Each elongate element has a middle portion and two end portions extending in the plane of the sheet from the middle portion.

As shown in FIG. 4B, a layer of masking material 408, such as photoresist, is applied to one surface of the soft metal sheet outside the areas of the elongate elements. The end portions of each elongate element are bent out-of-plane with respect to the sheet. A one end portion 404a of the elongate element 404 is bent in a one direction (upward, as illustrated), thereby forming a tab extending upward from the sheet 402. The other end portion 404b of the elongate element is bent in an opposite (downward, as illustrated) direction, thereby forming a tab extending downward from the sheet 402. The tabs (404a, 404b) may extend to virtually any desired distance from the sheet, for example 5–100 mils for microelectronic applications. The shapes of these tabs (404a, 404b) can independently be controlled in the bending process, so that the upward-extending tabs have the same or a different shape than the downward-extending tabs.

It should be understood that the tabs can be formed in the same step as the patterning of the elongate elements, and these steps can be performed with conventional equipment.

As illustrated in FIG. 4C, an insulating (dielectric) support layer 410, such as a sheet (film, plate) of Kapton (tm) or polyimide, is provided with a plurality of holes 412. The insulating sheet 410 is placed over the soft metal sheet 402 so that the holes 412 align with the tabs, on a side of the sheet opposite the masking material, and is secured to the soft metal sheet with a suitable adhesive (not shown).

It is within the scope of this invention that the insulating sheet, both in this embodiment and embodiments described hereinbelow, can be a metal plate covered with a dielectric material.

The entire assembly is then overcoated with a hard material 412, such as nickel and its alloys. The support sheet 410 and the masking material 408 ensure that only the elongate elements are overcoated with the hard material. Finally, the masking material 408 is stripped away, and the soft metal that has not been overcoated is removed, such as by selective chemical etching. This process leaves interconnection elements electrically isolated from one another while being held in fixed relationship relative to one another by the remaining layer as shown in FIG. 4D. Optionally, in a post-finishing step, the interconnection elements can be overcoated (e.g., plated) with a material exhibiting good contact resistivity characteristics, such as gold.

This results in an interconnection structure having composite interconnection elements (the overcoated tabs) extending from the top and bottom surfaces thereof, as shown in FIG. 4D, each one of the upward-extending composite interconnection elements functioning as a cantilever, and being connected by the foil (402) to a corresponding one of the downward-extending tabs which also function as a cantilever, each of the composite interconnection elements being capable of imparting a desired contact force (e.g., 15 grams) to a respective terminal of an electronic component.

In this manner, an interposer 400 is obtained, having two ends for connecting a terminal 420 of a first electronic component (not shown) to a corresponding terminal 422 of a second electronic component (not shown), and a second interconnection structure suitable for use in an interposer is obtained, having two ends for connecting a terminal 424 of the first electronic component (not shown) to a corresponding terminal 426 of the second electronic component (not shown).

FIG. 4D illustrates an interconnection structure 400 which is formed from an elongate element 416, overcoated by the same material 412, in the manner of forming the aforementioned interconnection structures. The elongate element 416 is aligned longitudinally with and at a distance from the elongate element 406, and the elongate element 404 is aligned laterally with and at a distance from the elongate element 406, demonstrating that the interconnection elements can be disposed in arrays. The spacing between adjacent elongate elements is discussed in greater detail hereinbelow, with respect to FIGS. 7A and 7B.

An advantage of this and, as will be evident, subsequently-described techniques, is that a soft, non-resilient metal sheet, which is easily formed (punched and shaped) can be overcoated to exhibit robust resilient characteristics, in a manner similar to the soft wire core being shaped and overcoated to exhibit resiliency.

It is within the scope of this invention that a fixture may perform the function of the masking material 408, during the overcoating (e.g., plating) process, making the masking material unnecessary.

It is within the scope of this invention that a plurality of interconnection elements can be formed as individual contact structures, subsequently to be supported in proximity to one another, such as with a support sheet.

Generally, the support layer (410) supports a plurality of interconnection elements in a prescribed relationship to one another, such as in a rectangular (x,y) array pattern. The support layer can be flexible, as described hereinabove, or can be rigid (e.g., such as made of ceramic). A flexible support layer has the advantage of allowing the supported interconnection elements to "float", within a certain range of vertical positions, to accommodate surface variations (tolerances) in electronic components being connected to. This subject will be described in greater detail in the discussion of FIGS. 7A and 7B.

CANTILEVER EMBODIMENT #2

FIGS. 5A–5F illustrate an alternate technique for making. an interposer from a flat sheet of metal.

Figure 5A:
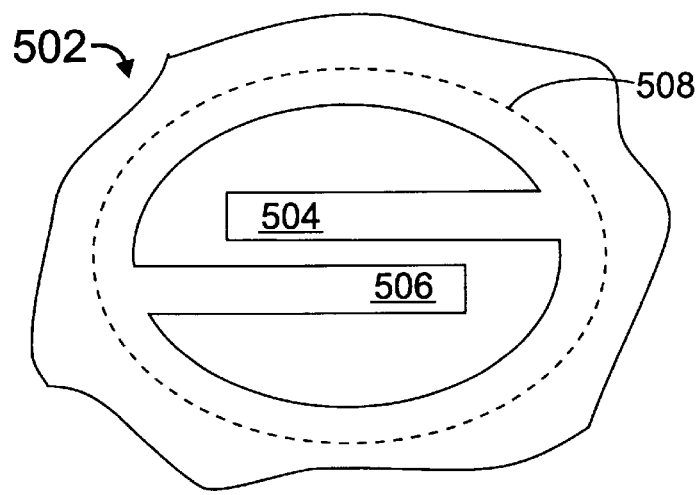
FIG. 5A is a top plan view of a soft metal foil, in a preliminary step of making an interposer, according to an alternate embodiment of the invention.

As shown in FIG. 5A, a flat sheet of soft metal (e.g., copper) sheet (e.g., foil) is patterned (punched, etched, or the like) to have two, diametrically opposed elongate elements 504 and 506, which are generally next to and parallel to one another. The elongate elements 502 and 504 are held at their base ends by a ring 508.

Figure 5B:
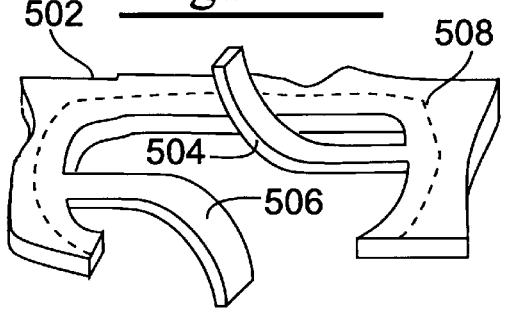
FIG. 5B is a perspective view of the soft metal foil of FIG. 5A, in a subsequent process step, according to the invention.

In a manner similar to the embodiment of FIGS. 4A–4D, a one of the elongate elements 504 is bent to be a tab extending in one direction, and another of the elongate elements 506 is bent as a tab extending in an opposite direction, resulting in the configuration shown in FIG. 5B (compare FIG. 4B).

Figure 5C:
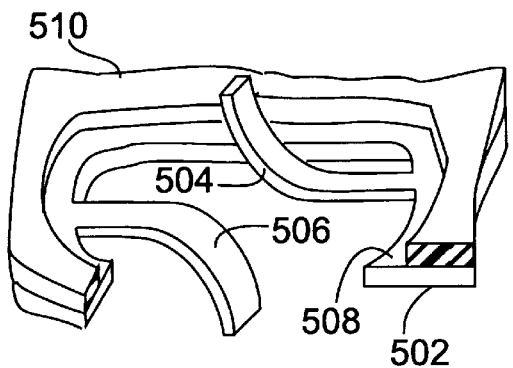
FIG. 5C is a perspective view of the soft metal foil of FIG. 5A, in a subsequent process step, according to the invention.
Figure 5D:
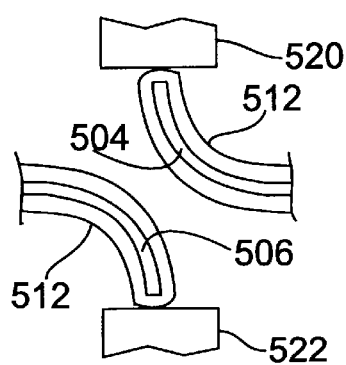
FIG. 5D is a perspective view of the soft metal foil of FIG. 5A, in a subsequent process step, in use as an interposer between two electronic components, according to the invention.

As shown in FIG. 5C, a suitable masking material 510 such as photoresist is applied to the sheet 502, outside the area of the ring 506 and the elongate elements 504 and 506.

The sheet 502 is then overcoated (e.g., plated) with a hard metallic material (e.g., nickel or its alloys) 512, thereby transforming the tabs (shaped elongate elements 504 and 506) into interconnection elements functioning as springs. Next, the masking material 510 is removed, and all non-overcoated (by 512) soft metal (502) is removed, such as by selective etching, resulting in the interposer structure 500 of FIG. 5D, having composite interconnection elements pointing up and corresponding composite interconnection elements pointing down, both the upward and downward pointing interconnection elements functioning as cantilevers, each capable of imparting a desired contact force (e.g., 15 grams) to a respective terminal of an electronic component.

In this manner, an interposer 500 is obtained, having two ends for connecting a terminal 520 of a first electronic component (not shown) to a corresponding terminal 522 of a second electronic component (not shown).

As a general proposition, the embodiment 400 of FIGS. 4A–4D is preferred over the embodiment 500 of FIGS. 5A–5D.

CANTILEVER EMBODIMENT #3

As shown in FIGS. 6A–6D, a similar (e.g., to the embodiment previously described with respect to FIGS. 5A–5E) can be obtained by patterning a soft metal foil 602 to have two, parallel (side-by-side) elongate elements 604 and 606, which share a common base portion 608.

Figure 6A:
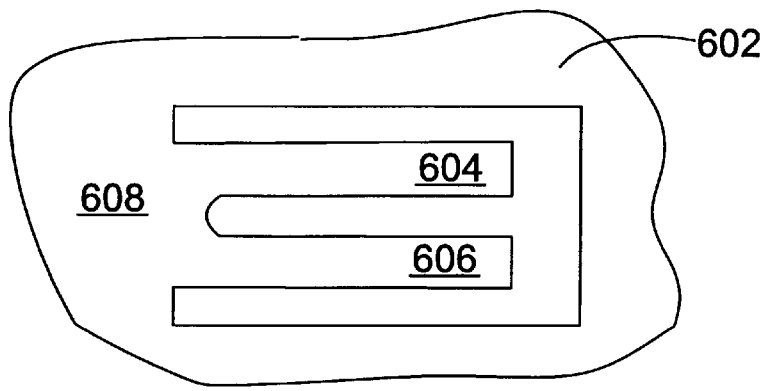
FIG. 6A is a top plan view of a soft metal foil, in a preliminary step of making an interposer, according to an alternate embodiment of the invention.
Figure 6B:
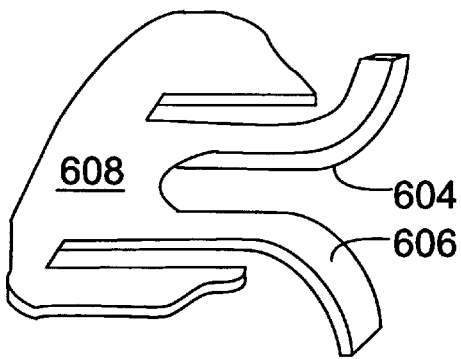
FIG. 6B is a perspective view of the soft metal foil of FIG. 6A, in a subsequent process step, according to the invention.

A one of the elongate elements 604 is bent to be a tab extending in one direction, and another of the elongate elements 606 is bent to be a tab extending in an opposite direction, resulting in the configuration shown in FIG. 6B (compare FIG. 5B).

Figure 6C:
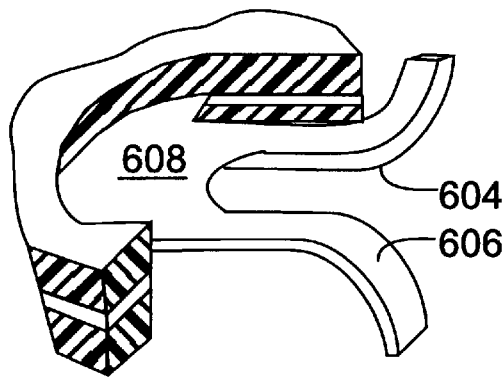
FIG. 6C is a perspective view of the soft metal foil of FIG. 6A, in a subsequent process step, according to the invention.
Figure 6D:
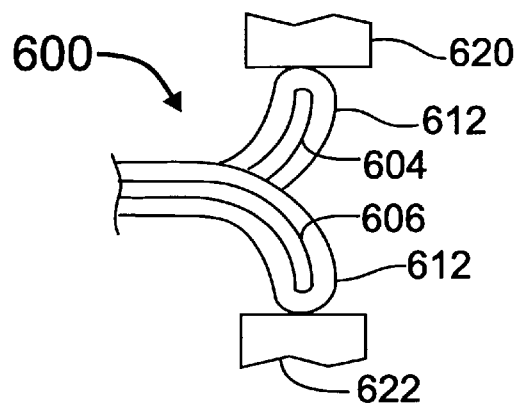
FIG. 6D is a perspective view of the soft metal foil of FIG. 6A, in a subsequent process step, in use as an interposer between two electronic components, according to the invention.

As shown in FIG. 6C, a suitable masking material such as photoresist 610 is applied to the sheet 602, outside the area of the elongate elements 604 and 606 and their common base 608.

The sheet 602 is then overcoated (e.g., plated) with a hard metallic material (e.g., nickel or its alloys) 612, thereby transforming the tabs (shaped elongate elements 604 and 606) into interconnection elements functioning as springs. Next, the masking material 610 is removed, and all non-overcoated (by 612) soft metal (602) is removed, such as by selective etching, resulting in the interposer structure 600 of FIG. 6D, having composite interconnection elements pointing up and corresponding composite interconnection elements pointing down, both the upward and downward pointing composite interconnection elements functioning as cantilevers, each capable of imparting a desired contact force (e.g., 15 grams) to a respective terminal of an electronic component.

In this manner, an interposer 600, is obtained, having two ends for connecting a terminal 620 of a first electronic component (not shown) to a corresponding terminal 622 of a second electronic component (not shown).

Although not shown, it within the scope of this invention that a plurality of interconnection elements can be located in a desired pattern (e.g., a rectangular array) by securing them to a suitable support member such as a sheet provided with a plurality of holes, as shown in FIG. 4C.

"HYBRID" EMBODIMENT

With reference, for example, to the embodiment 400 of FIGS. 4A–4D, it is evident that the original (prior to bending) length of the elongate elements (404, 406) establish a limit to how far the tabs can extend from the sheet—in other words, a limitation on the length (and/or height) of the resulting interconnection element.

As used herein, the term "length" generally refers to the longitudinal dimension of an elongate element prior to shaping (if any), and the term "height" generally refers to the longitudinal dimension of the elongate element (and resulting interconnection element) after shaping and coating. For purposes of the discussion set forth in this document, these terms are generally interchangeable.

As mentioned hereinabove, an area of concern in microelectronics is fabricating arrays of interconnection elements at a fine pitch, such as 0.010 inches (10 mils) between adjacent interconnection elements, which is desirable. It may, however, also be desirable for each interconnection element to have a height of 50 mils, 100 mils, or more. With reference to FIG. 4D, it is evident that a spacing of 10 mils between adjacent interconnect structures (e.g., 406 and 416) would render such heights for the interconnection elements physically impossible.

Figure 7A:
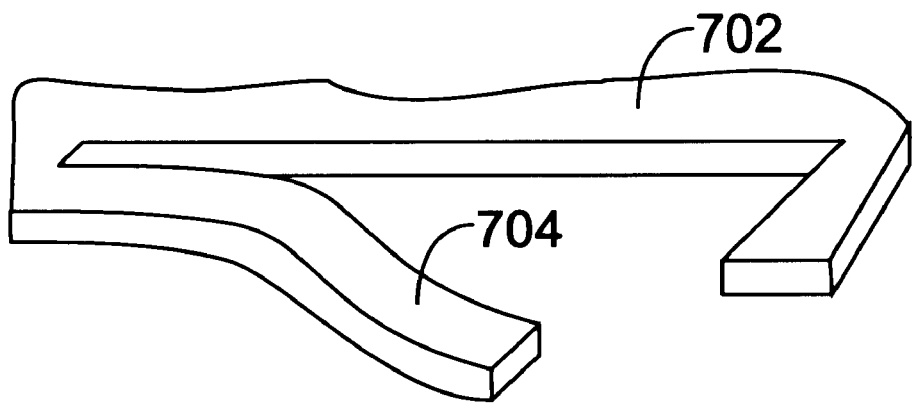
FIG. 7A is a top plan view of a soft metal foil, in a preliminary step of making an interposer, according to an alternate embodiment of the invention.
Figure 7B:
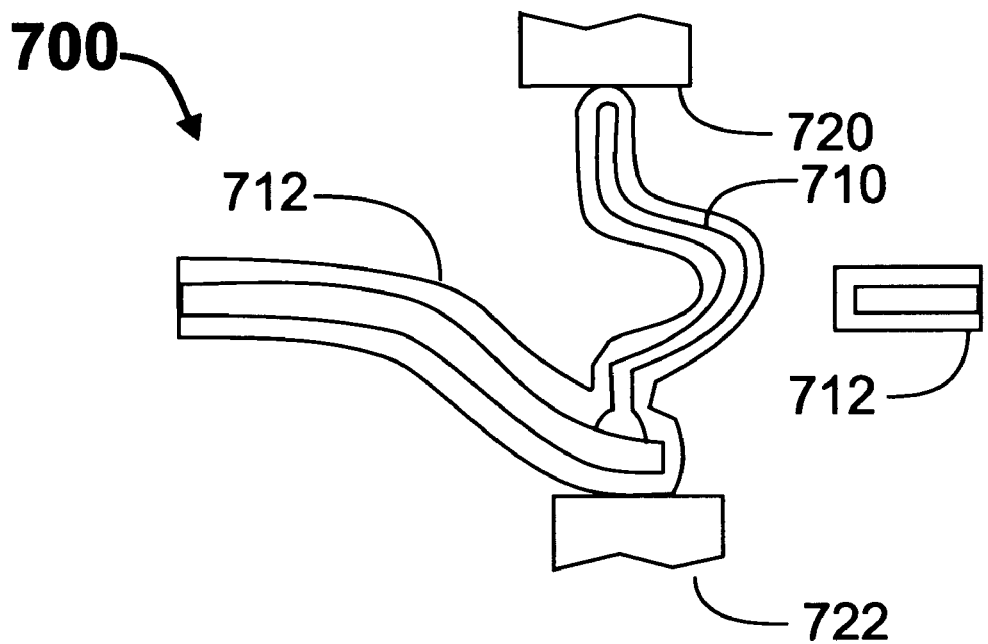
FIG. 7B is a perspective view of the soft metal foil of FIG. 7A, in a subsequent process step, in use as an interposer between two electronic components, according to the invention.

FIGS. 7A and 7B illustrate a technique for overcoming these physical limitations, according to the invention.

FIG. 7A illustrates a flat sheet 702 of a soft material. A single elongate element 704 (compare 404, 504, 604) is formed in the sheet 702, and is bent in a one direction (downward, as illustrated), thereby forming a tab extending downward from the sheet 702.

Since, as mentioned hereinabove, it is desirable to have interconnection elements with significant lengths, yet closely spaced to one another, a core 710 is attached to the upper (as viewed) surface of the tab, near the free end of the tab, and shaped to have a springable shape. The core can have any springable shape (compare, e.g., the shape shown in FIG. 1B), and can be of virtually any desired length, and is suitably a gold bond wire bonded to the tab. As shown in FIG. 7B, the resulting assembly of tab 704 and core 710 is overcoated with a hard material 712, such as nickel and its alloys. The core 710 extends generally normally (e.g., at ninety degrees) to the surface of the tab 704.

In this manner, an interconnection structure suitable for use in an interposer is obtained, having two ends for connecting a terminal 720 of a first electronic component (not shown) to a corresponding terminal 722 of a second electronic component (not shown).

The tab (elongate element 704 overplated with material 712) functions as a "floating support" for the core 710, and also establishes a contact tip at the lower (as viewed) end of the core. This is advantageous, especially in applications where the interconnection element is required to accommodate gross deviations in the coplanarity of terminals of an electronic component to which it is desired to make contact.

For example, an electronic component may have a non-planar surface, in which case the terminals (e.g., 722) of the electronic component will be at different positions in the "z" (vertical) axis. Two mechanisms function to accommodate these non-planarities. First, the tab (704) readily functions to accommodate these irregularities (positional tolerances), while permitting the interconnection element 710 to establish a fairly constant and predictable resilient force between the two interconnected electronic components. Second, the overcoated core may also exhibit a combination of plastic and elastic deformation, the plastic deformation accommodating the non-planarity of terminals on the electronic component. Hence, the overcoated elongate element 704 functions principally as a floating support for the overcoated elongate element 710, without making a significant contribution to the contact force exerted by the overcoated elongate element 710, even if it is much stiffer than the overcoated elongate element 710. (Compare the elastomeric support 338 of the embodiment 330 of FIG. 3B).

Alternatively, the elongate element 704 can be substantially entirely masked (compare, for example, the masking material 510 of FIG. 5C) so that the elongate element 704 reacts forces primarily by plastic deformation, rather than by elastic deformation. In this regard, such an alternative construction would bear some (limited) functional similarity to the embodiment shown in FIG. 3B. It is within the scope of this invention that the elongate element 704 is partially or fully masked, to tailor its physical characteristics by controlling the amount of overcoat material 712 formed thereon.

As is evident, the embodiment 700 of FIGS. 7A–7B enable interconnection elements to be fabricated with a fine (e.g., 10 mil) pitch, yet be of lengths and extend to heights much greater than their pitch (e.g., 100 mils).

It is within the scope of this invention that the core (710) could be mounted on an end flat spiral spring, such as the inner end of the spiral spring shown in the aforementioned U.S. Pat. No. 4,893,172.

FABRICATING INDIVIDUAL INTERCONNECTION ELEMENTS

Figure 8A:
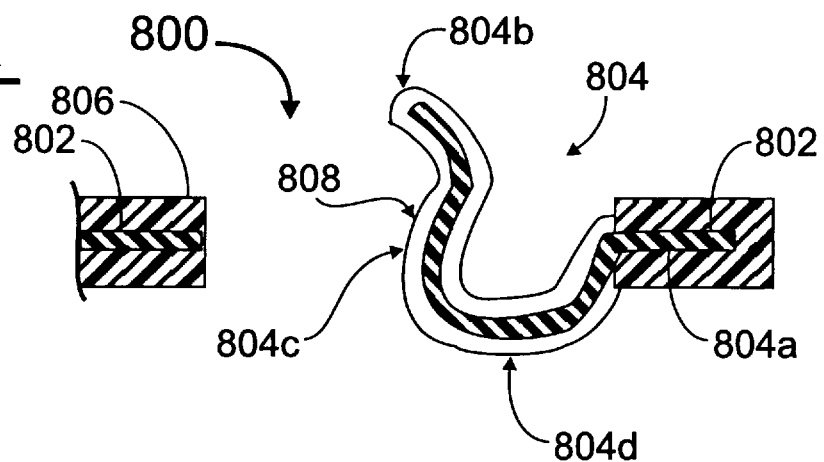
FIG. 8A is a cross-sectional view of a technique which is particularly well suited to making individual interconnection elements, according to the invention.
Figure 8B:
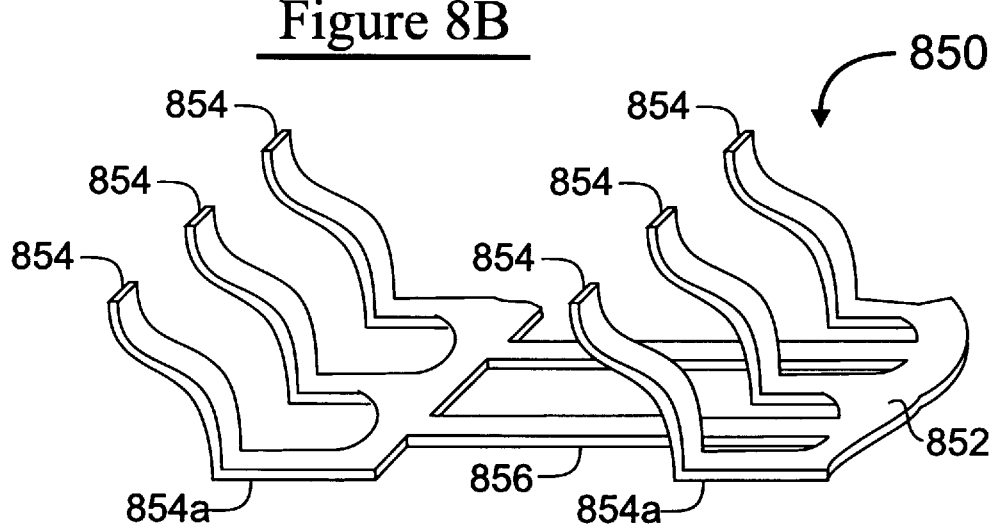
FIG. 8B is a cross-sectional view of another technique which is particularly well suited to making individual interconnection elements, according to the invention.

FIGS. 8A and 8B are illustrative of techniques for making individual interconnection elements, such as for stockpiling a plurality of such "spring contact" elements, and later automatically assembling them to an electronic component such as a semiconductor device or a support substrate for an interposer.

FIG. 8A illustrates a technique 800 wherein a flat sheet (foil) 802 of a material such as soft copper is punched, etched or the like to have a plurality (one of many shown) of elongate elements (tabs) 804. The elongate elements 804 are subsequently shaped to have a spring shape. Each elongate element 804 has a base portion 804a which is essentially a vestigial (residual) portion of the sheet 802 and which preferably is allowed to remain coplanar with the sheet 802. Each elongate element 804 has an end (tip) 804b at an opposite end of the elongate element 804 from the base portion 804a. The elongate element 804 is bent to have any suitable springable shape in a region 804c which is located between the tip 804b and a portion 804d adjacent the base portion 804a.

Suitable masking material 806, such as photoresist, is applied onto both sides of the sheet 802, including (as shown) optionally over the base portion 804a of the elongate element 804, leaving the "operative" portion of the elongate element 804 unmasked. The elongate element is then overcoated with a suitable material 808, selected for its ability to impart resilience to the resulting interconnection element, as described hereinabove. The overcoat material may optionally cover the base portion 804a of the elongate element 804.

The masking material 806 is then removed, such as by selective etching. This results in a plurality of individual composite interconnection elements which can be mounted to an electronic component, or supported in a prescribed spatial relationship (e.g., an array) with one another by affixing their base portions (804a) to a support substrate. Alternatively, a plurality of interconnection elements formed according to this technique can be suspended in an array by an elastomer.

FIG. 8B illustrates another technique 850 wherein a flat sheet (foil) 852 of a material such as soft copper is punched, etched or the like to have a plurality (six of many shown) of elongate elements (tabs) 854. Each tab 854a which is comparable to the base portion 804a in the previous embodiment 800. In this embodiment 850, the sheet is punched so that the base portions 854a are all interconnected with one another. The illustrated "bridges" 856 are merely exemplary. The elongate elements may be shaped during or subsequent to punching the sheet.

The elongate elements 854 are shaped to have a spring shape, then are overcoated with a suitable material (not shown), as described hereinabove. The overcoating (not shown, described hereinabove) is preferably applied while the elongate elements are still interconnected with one another, and it is not necessary that any masking material be applied.

In a final step, the sheet comprising the plurality of interconnected, overcoated elongate elements is further punched, to singulate (separate) the individual overcoated elongate elements (interconnection elements) from one another.

As in the previous example 800, this technique 850 results in a plurality of individual composite interconnection elements which can be mounted to an electronic component, or supported in an array with one another by affixing their base portions to a support substrate. Alternatively, a plurality of interconnection elements formed according to this technique can be suspended in an array by an elastomer.

FABRICATING CONNECTORS/SOCKETS

Figure 9:
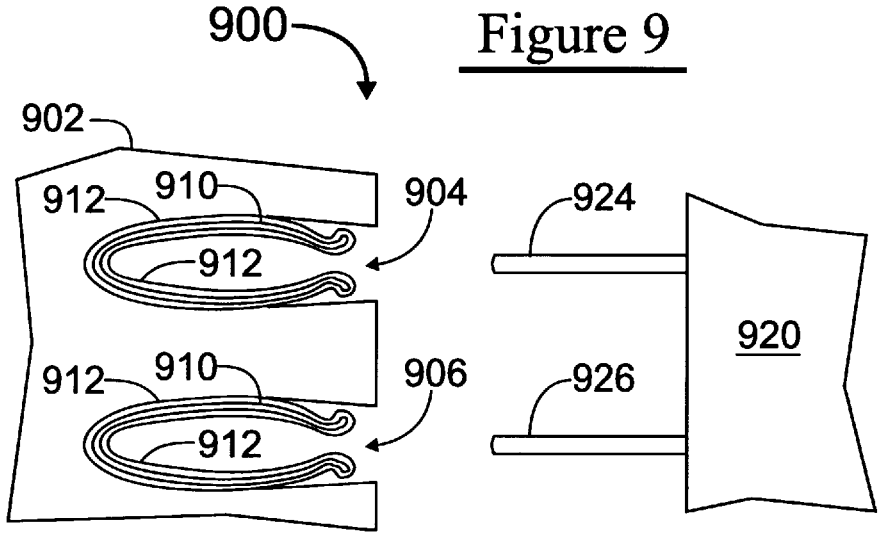
FIG. 9 is a cross-sectional view of a connector, and an electronic component positioned to plug into the connector, according to the invention.

FIG. 9 illustrates another advantageous use of the techniques described hereinabove with respect to making interconnection elements from a sheet of soft material which has been overcoated with a hard material. A connector 900 is illustrated which comprises a plastic connector body 902 and a plurality (two of many shown) of interconnection elements 904, 906 embedded within the connector body 902. Each interconnection element (902, 904) is fabricated in a manner similar to that described hereinabove with respect to the interposer of FIGS. 4A–4D—namely, a soft metal sheet 910 is pattered and formed to have a particular shape, and is then overcoated with a hard metal material 912 to provide desired mechanical characteristics (e.g., resiliency). As in the previous example, a final layer (not shown) of material having excellent electrical characteristics (e.g., gold) can be applied to the overcoated interconnection elements.

The connector 900 is suitable for receiving another mating connector or electronic component, such as is shown by the electronic component 920 having pins 924 and 926 extending from a surface thereof, the pins 924 and 926 inserting into the interconnection elements 904 and 906, respectively.

As mentioned hereinabove, the present invention differs dramatically from the prior art in that an overcoat is used to impart desired mechanical characteristics (e.g., elasticity) to an otherwise non-elastic, readily-formed, inchoate interconnection element (contact structure). In the prior art, coatings (including gold platings) are principally used to enhance electrical characteristics of interconnection elements, and to prevent corrosion thereof.

Interconnection elements can either be fabricated "in-situ" on electronic components, or "pre-fabricated" for later mounting to electronic components.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein. Several of these variations are set forth in the parent case.

What is claimed is:

1. Method of making an interposer, comprising:

forming an interconnection element as two tabs, a first tab and a second tab, in a sheet of a first material;

bending the tabs so that one of the two tabs extends in a first direction from the sheet, and so that another of the two tabs extends in a second direction from the sheet;

overcoating the tabs with a second material which has a higher yield strength than the first material.

2. Method, according to claim 1, further comprising:

providing a plurality of interconnection elements; and supporting the plurality of interconnection elements in a spatial relationship to one another with an insulating sheet.

3. Method, according to claim 1, wherein:

prior to bending the tabs, the first tab is longitudinally in line with the second tab.

4. Method, according to claim 1, wherein:

prior to bending the tabs, the first tab is parallel to the second tab.

5. Method, according to claim 1, wherein:

prior to bending the tabs, the first tab is parallel to the second tab, and the tabs share a common base portion.

6. Method, according to claim 1, wherein the first material is flexible and the tabs are bent so that contact regions thereof are remote from a remainder of the sheet.

7. Method, according to claim 1, further comprising:

masking a portion of the sheet with a masking layer, wherein the tabs are selectively overcoated and the masking layer prevents overcoating of the portion of the sheet when the tabs are overcoated.

8. Method, according to claim 1, wherein each tab has a base and the base is overcoated with the second material.

9. Method, according to claim 1, wherein the tabs are flexible and the overcoating has dimensions which are sufficient to act resiliently and allow for movement of a contact element including one tab and a respective overcoating under spring action.

10. Method, according to claim 1, wherein the first material is between 0.001 and 0.005 inches thick.

11. Method, according to claim 1, wherein each tab extends by a distance of between 5 and 100 mils from the sheet.

12. Method, according to claim 1, wherein the first material is selected from the group consisting of gold, soft copper alloy, and soft aluminum alloy.

13. Method, according to claim 1, wherein the second material includes nickel.

14. Method, according to claim 1, further comprising:

forming another interconnection element as two tabs, a third tab and a fourth tab, in the sheet;

supporting the interconnection elements in fixed relationship relative to one another; and removing a portion of the sheet to isolate the interconnection elements electrically from one another, the interconnection elements still being held in fixed relationship relative to one another after the portion is removed.

15. Method of making an interposer, comprising:

forming first, second, third, and fourth tabs in a sheet of a first material;

bending the tabs so that the first and third tabs extend in a first direction from a first side of the sheet and the second and fourth tabs extend in a second direction, opposing the first direction, from a second side of the sheet;

covering the first side of the sheet with a first non-conductive layer having a first opening over the first tab and a second opening over the third tab, a first portion of the sheet between the first and third tabs being covered with the first non-conductive layer;

covering the second side of the sheet with a second non-conductive layer having a first opening over the second tab and a second opening over the fourth tab, a second portion of the sheet between the second and fourth tabs being covered with the second non-conductive layer;

plating a layer of a second material onto the first tab, onto the second tab, onto the third tab and onto the fourth tab, the first non-conductive layer preventing plating on the first portion and the second non-conductive layer preventing plating of the second portion;

removing the first non-conductive layer to expose the first portion; and removing the first portion by selectively etching the first portion, thereby electrically isolating first and second interconnection elements from one another, the first interconnection element including the first and second tabs and the second interconnection element including the third and fourth tabs, the first and second interconnection elements being electrically isolated from one another while being held in fixed relationship relative to one another by the second non-conductive layer.

* * * * *